United States Patent
Sasaki et al.

(10) Patent No.: US 6,774,641 B2
(45) Date of Patent: Aug. 10, 2004

(54) PRINTED CIRCUIT BOARD DESIGN SUPPORT APPARATUS, METHOD, AND PROGRAM

(75) Inventors: Hideki Sasaki, Tokyo (JP); Takahiro Yaguchi, Kanagawa (JP); Akira Wakui, Kanagawa (JP); Seishi Eya, Kanagawa (JP); Takashi Harada, Tokyo (JP); Toshihide Kuriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 224 days.

(21) Appl. No.: 10/173,007

(22) Filed: Jun. 18, 2002

(65) Prior Publication Data

US 2003/0046651 A1 Mar. 6, 2003

(30) Foreign Application Priority Data

Jun. 20, 2001 (JP) ........................................ 2001-186998

(51) Int. Cl.⁷ .............................................. G01R 27/28
(52) U.S. Cl. ........................... 324/627; 361/782; 716/4; 716/11
(58) Field of Search ................................ 324/627, 612; 361/763, 764, 772, 780–782, 794; 716/1–21; 331/1; 257/660

(56) References Cited

U.S. PATENT DOCUMENTS 6,297,965 B1 * 10/2001 Sasaki et al. ................ 361/782
6,557,154 B1 * 4/2003 Harada et al. ................. 716/11
6,598,208 B2 * 7/2003 Sasaki et al. ................... 716/4

FOREIGN PATENT DOCUMENTS

| JP | 5-67176 A | 3/1993 |
| JP | 10-49568 A | 2/1998 |
| JP | 2001-134626 A | 5/2001 |

OTHER PUBLICATIONS

R. Dockey, "Asymmetrical Mode Radiation From Multi-layer Printed Circuit Boards", EMC/ESD International Symposium, (1992), pp. 247–251 with Abstract.

B. Archambeault, "Modeling of EMI Emissions from Microstrip Structures with Imperfect Reference Planes", IEEE International Symposium on Electromagnetic Compatibility, Austin, 1997, pp. 456–461.

T. Miyashita et al., "Prediction of Peak Frequencies on Electromagnetic Emission from a Signal Line on a Printed Circuit Board", IEICE Trans. Commun., vol. E78, No. 2, (Feb. 1995), pp. 181–187.

* cited by examiner

Primary Examiner—Minh Chau
(74) Attorney, Agent, or Firm—Sughrue Mion, PLLC

(57) ABSTRACT

In a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, an arithmetic unit calculates a common mode (CM) radiation amount of the interconnection on the basis of a CM radiation amount ratio that indicates a ratio of a common mode (CM) radiation amount of electromagnetic radiation caused by the ground plane in correspondence with the interconnection to a differential mode (DM) radiation amount of electromagnetic radiation caused by the interconnection. A printed circuit board design support method and program are also disclosed.

21 Claims, 16 Drawing Sheets

PRINTED CIRCUIT BOARD DESIGN SUPPORT APPARATUS, METHOD, AND PROGRAM

BACKGROUND OF THE INVENTION

The present invention relates to a printed circuit board design support apparatus, method, and program and, more particularly, to a printed circuit board design support apparatus, method, and program which calculate the radiation amount of electromagnetic radiation from interconnections of a printed circuit board on the basis of printed circuit board design information related to the printed circuit board, components, and interconnections, thereby supporting design of a printed circuit board whose unwanted electromagnetic radiation is suppressed.

To prevent any adverse effect of unwanted electromagnetic waves radiated from electronic devices on public broadcastings or communications, it is necessary to suppress unwanted electromagnetic radiation from electronic devices and printed circuit boards mounted on the electronic devices. However, it is difficult to suppress electromagnetic radiation because causes thereof are hard to find. In some cases, to suppress electromagnetic radiation, a ferrite core is attached to the proximal end of the cable of a device, or a ferrite bead, a damping resistor, or various kinds of filters are inserted to a high-speed signal interconnection of a printed circuit board, resulting in an increase in cost of products. If even such measures are insufficient, boards are sometimes re-designed or re-manufactured. This delays shipping.

To suppress electromagnetic radiation without increasing the cost or delaying shipping, it is preferable to use a design method of suppressing electromagnetic radiation at the time of designing a printed circuit board. This is because the cost for correction can be suppressed at an upstream stage of design and development.

Under these circumstances, apparatuses for supporting design of a printed circuit board whose unwanted electromagnetic radiation is suppressed, design support methods, and storage media which store programs for supporting design have been conventionally proposed. Examples are "Printed Board CAD Apparatus" disclosed in Japanese Patent Laid-Open No. 5-67176, "Circuit Board Design Method and Storage Medium" disclosed in Japanese Patent Laid-Open No. 10-49568, and "Design Support Apparatus" disclosed in Japanese Patent Laid-Open No. 2001-134626.

FIG. 22 shows an embodiment of "Printed Board CAD Apparatus" disclosed in Japanese Patent Laid-Open No. 5-67176. In this prior art, a board surface is divided into a mesh pattern, and the current value of a signal path included in each divided mesh element is calculated. The visual attribute of the mesh is determined in accordance with the magnitude of the current value or a radiation noise predicted value for each mesh element, which is calculated on the basis of the current value. According to this prior art, the designer of a printed circuit board can intuitively understand the magnitude of the radiation noise amount on the basis of the magnitude of the current value or radiation noise predicted value indicated on the matrix. In addition, when the designer determines interconnections so as not to locally increase the indicator level, the noise amount on the board can be naturally dispersed.

FIG. 23 shows a flow chart of "Circuit Board Design Method and Storage Medium" disclosed in Japanese Patent Laid-Open No. 10-49568. In this prior art, in steps S22 to S24, signal lines are virtually interconnected on a virtual section read out from a virtual section description table, and an unwanted radiation amount X is calculated. In step S27, for a signal interconnection whose unwanted radiation amount X exceeds an allowable value A, an improved solution N1 for an improved virtual section and an improved solution N2 with a target component inserted are calculated. In step S28, the improved solutions N1 and N2 are assigned to layer structures read out from a layer structure description table. In steps S29 and S30, practical solutions P are extracted from combinations of the improved solutions N1 and N2 and the layer structures. An optimum solution Q is selected from the practical solutions P on the basis of the manufacturing cost and unwanted radiation amount. In step S31, the signal lines are automatically interconnected to a layer structure determined by the optimum solution Q. By this prior art, radiation noise can be evaluated and noise measures can be taken at an early stage of board design.

FIG. 24 shows the overall arrangement of "Design Support Apparatus" disclosed in Japanese Patent Laid-Open No. 2001-134626. As a characteristic feature, this prior art comprises a means (design data storage means 107) for storing design information related to boards, components, and networks, a means (layout component selection means 110) for selecting a component to be laid out, a means (high-speed network search means 111) for searching the design data storage means for a high-speed network to be connected to the component to be laid out, a means (virtual interconnection path determination means 940) for determining a virtual interconnection path of the high-speed network searched by the high-speed network search means, a means (radiation noise calculation means 950) for calculating radiation noise of the high-speed network interconnected to the virtual interconnection path, and a means (radiation noise indicating information generation means 115) for generating information that indicates radiation noise. According to this prior art, radiation noise simulation is done in laying out a component, and a radiation noise amount for the high-speed network connected to the component (layout component) to be laid out can be indicated to the designer in various indicating patterns. For this reason, an appropriate layout position of each layout component can be obtained, and interconnection design with a satisfactory radiation noise characteristic can be done.

In the above prior-art methods, as electromagnetic radiation from a printed circuit board, only electromagnetic radiation from signal interconnections (electromagnetic radiation called differential mode radiation or normal mode radiation) is handled.

In differential mode radiation, a closed circuit formed by signal interconnections acts like a loop antenna and emits electromagnetic radiation. As a general example, when a transmitting-side IC and receiving-side IC are connected by a microstrip line formed from an interconnection pattern and ground plane, a current flowing through the interconnection pattern and a mirror-image current of the interconnection pattern centered about the ground plane flow as a current of the closed loop. This causes radiation as in a loop antenna. Details are described in, e.g., IEICE TRAN. COMMUN., VOL. E78-B, NO. 2 February 1995, "Prediction of Peak Frequencies on Electromagnetic Emission from a Signal Line on a Printed Circuit Board".

Electromagnetic radiation from a printed circuit board includes not only the radiation from a signal interconnection but also radiation from a ground plane opposing a signal interconnection (electromagnetic radiation called common mode radiation or asymmetrical mode radiation). For some boards, the common mode radiation is more dominant, as is reported. For example, reference 1 (R. Dockey, "Asymmetrical Mode Radiation from Multi-layer Printed Circuit Boards" EMC/ESD International Symposium, 1992, pp. 247–251) reports that a ground plane acts like a dipole antenna due to a current flowing through a signal interconnection, the entire ground plane causes resonance to induce strong electromagnetic radiation, and the radiation amount changes depending on the width of the ground plane.

Reference 2 (B. Archambeault, "Modeling of EMI Emissions from Microstrip Structures with Imperfect Reference Planes", IEEE International Symposium on Electromagnetic Compatibility, Austin, 1997, pp. 456–461) reports that as the distance between a signal interconnection and an edge portion of a ground plane decreases, the electromagnetic radiation amount from a printed circuit board increases. These reports suggest that to design a printed circuit board with suppressed electromagnetic radiation, common mode radiation from a ground plane whose radiation amount largely changes depending on the size of the ground plane or the position of the signal interconnection should be taken into consideration as well as differential mode radiation from a signal interconnection.

Hence, in calculating an electromagnetic radiation amount from a signal interconnection, to calculate the radiation amount of common mode radiation in addition to the radiation amount of differential mode radiation obtained by a conventional method, a method using electromagnetic field simulation as in reference 2 can be used.

However, to calculate the radiation amount of a large-scale printed circuit board having a number of signal interconnections using such an electromagnetic field simulator, a large memory must be prepared. In addition, it takes a long calculation time. For these reasons, it is very difficult in the present circumstances to execute electromagnetic field simulation simultaneously with board design.

SUMMARY OF THE INVENTION

The present invention has been made to solve the above problem, and has as its object to provide a printed circuit board design support apparatus, method, and program which are capable of easily calculating an amount of electromagnetic radiation that occurs due to an interconnection of a printed circuit board and easily and accurately grasping the electromagnetic radiation amount of each interconnection without executing electromagnetic field simulation.

In order to achieve the above object, according to an aspect of the present invention, there is provided a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising arithmetic means for calculating a common mode (CM) radiation amount of the interconnection on the basis of a CM radiation amount ratio that indicates a ratio of a common mode (CM) radiation amount of electromagnetic radiation caused by the ground plane in correspondence with the interconnection to a differential mode (DM) radiation amount of electromagnetic radiation caused by the interconnection.

The arithmetic means may calculate, as a major (MAJ) radiation amount that indicates a major radiation amount of electromagnetic radiation caused by the interconnection, a radiation amount corresponding to a sum of the differential mode (DM) radiation amount and common mode (CM) radiation amount of the interconnection. For example, the arithmetic means may calculate the major (MAJ) radiation amount of the interconnection on the basis of an MAJ radiation amount ratio that indicates a ratio of the major (MAJ) radiation amount to the differential mode (DM) radiation amount of the interconnection.

When a radiation amount from each interconnection is to be evaluated, the apparatus may further comprise comparison means for comparing the major (MAJ) radiation amount of the interconnection, which is calculated by the arithmetic means, with a limit value that indicates a desired limit of the radiation amount of the interconnection and outputting a comparison result.

As a detailed arrangement for calculating the common mode (CM) radiation amount of the interconnection, the arithmetic means may comprise DM radiation amount calculation means for calculating the differential mode (DM) radiation amount of the interconnection on the basis of the design information, CM radiation amount ratio calculation means for calculating the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, and CM radiation amount calculation means for calculating the common mode (CM) radiation amount of the interconnection on the basis of the CM radiation amount ratio calculated by the CM radiation amount ratio calculation means and the differential mode (DM) radiation amount calculated by the DM radiation amount calculation means.

As a detailed arrangement for calculating the major (MAJ) radiation amount of the interconnection, the arithmetic means may comprise DM radiation amount calculation means for calculating the differential mode (DM) radiation amount of the interconnection on the basis of the design information, CM radiation amount ratio calculation means for calculating the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, MAJ radiation amount ratio calculation means for calculating an MAJ radiation amount ratio that indicates a ratio of the major (MAJ) radiation amount to the differential mode (DM) radiation amount of the interconnection on the basis of the CM radiation amount ratio calculated by the CM radiation amount ratio calculation means, and MAJ radiation amount calculation means for calculating the major (MAJ) radiation amount of the interconnection on the basis of the MAJ radiation amount ratio calculated by the MAJ radiation amount ratio calculation means and the differential mode (DM) radiation amount calculated by the DM radiation amount calculation means.

To calculate the common mode (CM) radiation amount of the interconnection, the arithmetic means may further comprise CM radiation amount calculation means for calculating the common mode (CM) radiation amount of the interconnection on the basis of the CM radiation amount ratio calculated by the CM radiation amount ratio calculation means and the differential mode (DM) radiation amount calculated by the DM radiation amount calculation means.

As a detailed arrangement for calculating the major (MAJ) radiation amount of the interconnection, the arithmetic means may comprise DM radiation amount calculation means for calculating the differential mode (DM) radiation amount of the interconnection on the basis of the design information, CM radiation amount ratio calculation means for, letting a be a width of the ground plane opposing the interconnection in a direction parallel to the interconnection, b be a width in a direction perpendicular to the interconnection, and d be a distance from an edge of the ground plane to the interconnection, calculating the CM radiation amount ratio CM/DM(a,b,d) that indicates the ratio of the common mode (CM) radiation amount to the differential mode (DM) radiation amount of the interconnection by $$CM/DM(a, b, d) = 10^{\frac{y_0(a,b)+0.35 \cdot \exp\left[\frac{1-d}{b/2}\atop t(a,b)\right]}{20}}$$

$$y_0(a, b) = 0.57 + 24.47 \cdot \log\left(\frac{a}{b}\right) - 3.83 \cdot \left[\log\left(\frac{a}{b}\right)\right]^2$$

$$t(a, b) = 0.26 + 0.01 \cdot \left(\frac{a}{b}\right),$$

MAJ radiation amount ratio calculation means for calculating an MAJ radiation amount ratio MAJ/DM(a,b,d) that indicates a ratio of the major (MAJ) radiation amount to the differential mode (DM) radiation amount of the interconnection on the basis of the CM radiation amount ratio CM/DM(a,b,d) calculated by the CM radiation amount ratio calculation means by $$MAJ/DM(a,b,d)=1+CM/DM(a,b,d),$$

CM radiation amount calculation means for calculating the common mode (CM) radiation amount of the interconnection on the basis of the CM radiation amount ratio calculated by the CM radiation amount ratio calculation means and the differential mode (DM) radiation amount calculated by the DM radiation amount calculation means, and MAJ radiation amount calculation means for calculating the major (MAJ) radiation amount of the interconnection on the basis of the MAJ radiation amount ratio calculated by the MAJ radiation amount ratio calculation means and the differential mode (DM) radiation amount calculated by the DM radiation amount calculation means.

When each radiation amount is to be calculated particularly for each interconnection element of the interconnection, the DM radiation amount calculation means may calculate the differential mode (DM) radiation amount of the entire interconnection by calculating a differential mode (DM) radiation amount $E_{DM}(L)$ letting L be a length of each of a plurality of interconnection elements obtained by dividing the interconnection along two directions perpendicular to each other, and adding the differential mode (DM) radiation amounts $E_{DM}(L)$, the CM radiation amount ratio calculation means may calculate the CM radiation amount ratio CM/DM(a,b,d) for each interconnection element, the MAJ radiation amount ratio calculation means may calculate the MAJ radiation amount ratio MAJ/DM(a,b,d) for each interconnection element, the CM radiation amount calculation means may calculate the common mode (CM) radiation amount of the entire interconnection on the basis of the differential mode (DM) radiation amount $E_{DM}(L)$ and MAJ radiation amount ratio MAJ/DM(a,b,d) of each interconnection element by $$E_{CM} = \sum CM/DM(a, b, d) \cdot E_{DM}(L),$$

and the MAJ radiation amount calculation means may calculate the major (MAJ) radiation amount of the entire interconnection on the basis of the differential mode (DM) radiation amount $E_{DM}(L)$ and MAJ radiation amount ratio MAJ/DM(a,b,d) of each interconnection element by $$E_{MAJ} = \sum MAJ/DM(a, b, d) \cdot E_{DM}(L)$$

According to another aspect of the present invention, there is provided a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising arithmetic means for calculating, as a major (MAJ) radiation amount that indicates a major radiation amount of electromagnetic radiation caused by the interconnection, a radiation amount corresponding to a sum of a differential mode (DM) radiation amount of electromagnetic radiation caused by the interconnection and a common mode (CM) radiation amount of electromagnetic radiation caused by the ground plane in correspondence with the interconnection.

As a detailed arrangement for calculating the major (MAJ) radiation amount of the interconnection, the arithmetic means may comprise DM radiation amount calculation means for calculating the differential mode (DM) radiation amount of the interconnection on the basis of the design information, CM radiation amount ratio calculation means for calculating a CM radiation amount ratio that indicates a ratio of the common mode (CM) radiation amount to the differential mode (DM) radiation amount of the interconnection on the basis of the design information, MAJ radiation amount ratio calculation means for calculating an MAJ radiation amount ratio that indicates a ratio of the major (MAJ) radiation amount to the differential mode (DM) radiation amount of the interconnection on the basis of the CM radiation amount ratio calculated by the CM radiation amount ratio calculation means, CM radiation amount calculation means for calculating the common mode (CM) radiation amount of the interconnection on the basis of the CM radiation amount ratio calculated by the CM radiation amount ratio calculation means and the differential mode (DM) radiation amount calculated by the DM radiation amount calculation means, and MAJ radiation amount calculation means for calculating the major (MAJ) radiation amount of the interconnection on the basis of the MAJ radiation amount ratio calculated by the MAJ radiation amount ratio calculation means and the differential mode (DM) radiation amount calculated by the DM radiation amount calculation means.

According to an aspect of the present invention, there is provided a printed circuit board design support method used in a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising causing arithmetic means of the printed circuit board design support apparatus to calculate a common mode (CM) radiation amount of the interconnection on the basis of a CM radiation amount ratio that indicates a ratio of a common mode (CM) radiation amount of electromagnetic radiation caused by the ground plane in correspondence with the interconnection to a differential mode (DM) radiation amount of electromagnetic radiation caused by the interconnection.

The arithmetic means may calculate, as a major (MAJ) radiation amount that indicates a major radiation amount of electromagnetic radiation caused by the interconnection, a radiation amount corresponding to a sum of the differential mode (DM) radiation amount and common mode (CM) radiation amount of the interconnection.

As a detailed procedure, the arithmetic means may calculate the differential mode (DM) radiation amount of the interconnection on the basis of the design information, the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, the common mode (CM) radiation amount of the interconnection on the basis of the CM radiation amount ratio and differential mode (DM) radiation amount, an MAJ radiation amount ratio that indicates a ratio of the major (MAJ) radiation amount to the differential mode (DM) radiation amount of the interconnection on the basis of the CM radiation amount ratio, and the major (MAJ) radiation amount of the interconnection on the basis of the MAJ radiation amount ratio and differential mode (DM) radiation amount.

As a more detailed procedure, the arithmetic means may calculate the differential mode (DM) radiation amount of the interconnection on the basis of the design information, letting a be a width of the ground plane opposing the interconnection in a direction parallel to the interconnection, b be a width in a direction perpendicular to the interconnection, and d be a distance from an edge of the ground plane to the interconnection, the CM radiation amount ratio CM/DM(a,b,d) that indicates the ratio of the common mode (CM) radiation amount to the differential mode (DM) radiation amount of the interconnection by $$CM/DM(a,b,d) = 10^{\frac{y_0(a,b)+0.35 \cdot \exp\left[\frac{1-d}{b/2}\atop t(a,b)\right]}{20}}$$

$$y_0(a,b) = 0.57 + 24.47 \cdot \log\left(\frac{a}{b}\right) - 3.83 \cdot \left[\log\left(\frac{a}{b}\right)\right]^2$$

$$t(a,b) = 0.26 + 0.01 \cdot \left(\frac{a}{b}\right),$$

an MAJ radiation amount ratio MAJ/DM(a,b,d) that indicates a ratio of the major (MAJ) radiation amount to the differential mode (DM) radiation amount of the interconnection on the basis of the CM radiation amount ratio CM/DM(a,b,d) by MAJ/DM(a,b,d)=1+CM/DM(a,b,d), the common mode (CM) radiation amount of the interconnection on the basis of the CM radiation amount ratio and differential mode (DM) radiation amount, and the major (MAJ) radiation amount of the interconnection on the basis of the MAJ radiation amount ratio and differential mode (DM) radiation amount.

According to another aspect of the present invention, there is provided a printed circuit board design support method used in a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising causing arithmetic means of the printed circuit board design support apparatus to calculate, as a major (MAJ) radiation amount that indicates a major radiation amount of electromagnetic radiation caused by the interconnection, a radiation amount corresponding to a sum of a differential mode (DM) radiation amount of electromagnetic radiation caused by the interconnection and a common mode (CM) radiation amount of electromagnetic radiation caused by the ground plane in correspondence with the interconnection.

A program according to the present invention causes a computer arranged in a printed circuit board design support apparatus to execute the above-described procedures of the printed circuit board design support method. The steps of the program are the same as the above-described procedures of the printed circuit board design support method according to the present invention, and a description thereof will be omitted.

In the present invention having the above arrangement, the above-described problem is solved by the following functions.

First, that electromagnetic radiation from a printed circuit board corresponds to the synthesized value of differential mode (DM) radiation from a signal interconnection and common mode (CM) radiation from a ground plane will be described with reference to the accompanying drawings.

FIG. 13 shows a printed circuit board. A board 30 is a four-layered printed circuit board having a signal layer—ground layer—power supply layer—signal layer. The size of the board 30 is 210 mm (length)×100 mm (width)×1.6 mm (thickness). A quartz oscillator 31, LSI 32, load capacitors 33, and signal interconnections 34 that connect these components are arranged on the first layer serving as a signal layer. A 40-MHz clock signal is input from the quartz oscillator 31 to the LSI 32. A 20-MHz rectangular wave signal is output from the LSI 32 to the 16 7-pF (pico-farad) load capacitors 33. In addition, an initializing circuit 35 is arranged in a region adjacent to the LSI 32 on the first layer serving as a signal layer.

Since the 16 signal interconnections 34 arranged in parallel simultaneously operate, radiation from the board 30 is supposed to correspond to a synthesized value of radiation from the signal interconnections 34 and radiation from the ground plane (not shown) of the layer in the board 30. Within the range of 30 MHz to 1 GHz that comes into question for unwanted electromagnetic radiation, the length of the signal interconnection 34 is about 3 cm corresponding to a 1/10 wavelength of 1 GHz. Hence, the signal interconnections 34 act as a microloop antenna. Radiation from this microloop antenna is DM radiation.

Since the ground plane is excited in a direction along the signal interconnections, the long side of the ground plane acts as a dipole antenna. Radiation by this dipole antenna is CM radiation. When radiation amounts from the two antennas are synthesized, maximum radiation from the printed circuit board is determined.

FIGS. 14 to 16 show measurement results of radiation patterns of the board. The results were obtained by measuring field strength radiation patterns while arranging the board in a fully anechoic room with radio wave absorbers even on the floor surface. The distance between the board and a measurement antenna was 3 m. The height of the substrate and that of the measurement antenna were 1.5 m each. Measurements were executed while rotating the board through 360° in a plane parallel to the floor surface. FIG. 14 shows a result obtained when the board surface was arranged in parallel to the floor surface. FIG. 15 shows a result obtained when the board long side was arranged to be perpendicular to the floor surface. FIG. 16 shows a result obtained when the board short side was arranged to be perpendicular to the floor surface. FIGS. 14 to 16 also show the conceptual views of the radiation patterns of DM radiation and CM radiation. These results were obtained by measuring a 520-MHz component with the highest radiation level. A solid line indicates a horizontally polarized wave component. A broken line indicates a vertically polarized wave component. Referring to FIG. 14, the major polarized wave of DM radiation is a vertically polarized wave, and the major polarized wave of CM radiation is a horizontally polarized wave. As for the measurement results, both the shapes and the polarized waves match the conceptual views of DM radiation and CM radiation. For this reason, the maximum value of the horizontally polarized wave and that of the vertically polarized wave on the observation surface indicate the maximum value of CM radiation and the maximum value of DM radiation, respectively.

Referring to FIG. 15, both the major polarized wave of DM radiation and that of CM radiation are vertically polarized waves. Hence, in the measurement results as well, the major polarized wave is a vertically polarized wave whose level is maximized when θ=0° because the maximum value of DM radiation and that of CM radiation are synthesized. Referring to FIG. 16, both the major polarized wave of DM radiation and that of CM radiation are horizontally polarized waves. Hence, in the measurement results as well, the major polarized wave is a horizontally polarized wave whose level is maximized when φ=0° because the maximum value of DM radiation and that of CM radiation are synthesized.

The level of the electromagnetic wave (30 MHz to 1 GHz) measured here rarely abruptly rises at a specific position, unlike light having a shorter wavelength. For this reason, the maximum radiation level from the board is thoroughly observed by observing the three observation surfaces perpendicular to each other. The vertically polarized wave (Eφ) on the observation surface θ=0° in FIG. 15 and the horizontally polarized wave (Eφ) on the observation surface φ=0° in FIG. 16 are polarized waves at the same position. In FIGS. 15 and 16, the highest radiation level is observed at this position. Hence, it indicates maximum radiation from the board.

That is, the vertically polarized wave and horizontally polarized wave shown in FIG. 14 indicate DM radiation and CM radiation, respectively. The vertically polarized wave shown in FIG. 15 and the horizontally polarized wave shown in FIG. 16 indicate a synthesized value of DM radiation and CM radiation. In addition, the maximum value on the observation surface where DM radiation and CM radiation are synthesized corresponds to maximum radiation from the printed circuit board.

The present inventor found from the above examinations that when sufficiently short signal interconnections were handled, DM radiation, CM radiation, and maximum radiation as a synthesized value of DM radiation and CM radiation, i.e., a major (MAJ) radiation amount that indicates the major radiation amount of electromagnetic radiation caused by the signal interconnections could be separated by the polarizing characteristic of electromagnetic radiation from the printed circuit board. On the basis of this finding, FIGS. 17, 18, and 19 show the ratio (CM/DM) of a CM radiation amount to a DM radiation and the ratio (MAJ/DM) of a major radiation amount to a DM radiation amount. As for the measurement conditions, FIGS. 14, 15, and 16 correspond to FIGS. 17, 18, and 19, respectively.

Referring to FIGS. 17, 18, and 19, ■ indicates a result obtained when a coefficient was obtained from radiation field measurement result. A solid line indicates a result obtained when a coefficient was obtained by a commercially available FDTD (Finite Difference Time Domain) electromagnetic field simulator.

In the electromagnetic field simulation, the ground plane of a printed circuit board was modeled as a perfect conductive plate having the same planar size and an infinitesimal thickness. An interconnection portion for connecting an LSI and a load capacitor was modeled as a perfect conductive rod having an infinitesimal thickness. The semiconductor chip of an LSI was modeled as a voltage source. A load capacitor was modeled as a 1-Ω resistance component. The remaining components such as a thin dielectric member serving as a board material were neglected. As a simulation condition, a 10-layered PML (Perfect Matched Layer) was used for an absorption boundary condition. A Gaussian pulse was used as an input pulse. Under these conditions, radiation patterns were calculated within the range of 200 MHz to 1 GHz at a pitch of 20 MHz, a DM radiation component, CM radiation component, and a maximum radiation component corresponding to the sum of the DM and CM radiation components were extracted from the polarizing characteristic, thereby obtaining the ratios CM/DM and MAJ/DM. Since the envelopes of these ratios satisfactorily match in a broad band, the above finding can be applied in a broad band.

A DM radiation amount is determined by the shape of a signal interconnection or the value of a flowing current and therefore does not depend on the position of a signal interconnection. To the contrary, a CM radiation amount or a major radiation amount including a CM radiation amount largely depends on the position of a signal interconnection. For this reason, the CM/DM characteristic or MAJ/DM characteristic is obtained as a coefficient that represents the position dependence of a CM radiation amount or major radiation amount. FIG. 20 shows a CM/DM characteristic when a 10-mm long signal interconnection was arranged at the center of a ground plane having a size of 210 mm×100 mm and a CM/DM characteristic when a signal interconnection was arranged at the central position with respect to the long side direction and at a position separated by 5 mm from a ground plane edge parallel to the signal interconnection. The results were obtained by electromagnetic field simulation in accordance with the same procedure as described above. As described in reference 2, as the distance between the signal interconnection and the ground plane edge decreases, the CM radiation amount increases in a broad band. However, even when the position of the signal interconnection changes, the peak frequency does not change. This means that when the shape of the ground plane is determined, the peak frequency of radiation by the ground plane is automatically determined.

FIG. 21 also shows a result obtained by electromagnetic field simulation. The result is obtained by calculating the relationship between the CM/DM characteristic and the position of a signal interconnection in the direction of ground plane width at the peak frequency of the CM/DM characteristic. As the distance between the signal interconnection and the ground plane edge decreases, the value of CM/DM exponentially increases.

The present inventor repeated similar measurements and calculations while changing the shape of the ground plane of a printed circuit board and the position of an interconnection and checked in detail the manner the CM/DM characteristic and MAJ/DM characteristic changed when the ground plane size or interconnection position was changed. The present inventor found that when the size of the ground plane was determined, the CM/DM characteristic and MAJ/DM characteristic could be given by simple equations on the basis of lengths a and b of the ground plane in the vertical and horizontal directions and a distance d between the signal interconnection and the ground plane edge. The present inventor also found that when these equations were used, the CM/DM characteristic and MAJ/DM characteristic at the position of a signal interconnection could be obtained independently of the size of a rectangular ground plane.

On the other hand, a DM radiation amount can be obtained by a simple theoretical equation when the shape of a signal interconnection and the value of a flowing current are determined, as is known.

Hence, when the CM/DM characteristic and MAJ/DM characteristic are obtained from the relationship between the ground plane shape and the signal interconnection position using the equations, and the DM radiation amount of the signal interconnection is separately obtained, a CM radiation amount generated from the ground plane in correspondence with the signal interconnection and the major radiation amount of entire electromagnetic radiation caused by the signal interconnection can easily be calculated in a short time on the basis of the CM/DM and MAJ/DM characteristics and the DM radiation amount. For example, it took about 48 hrs to obtain the calculation results of the CM/DM ratio and MAJ/DM ratio by electromagnetic field simulation shown in FIGS. 17 to 19 by using a personal computer with Pentium III (registered trademark of a CPU available from Intel) and a clock frequency of 1 GHz. However, the equations were used, the results could be obtained in 1 sec or less, though only the values at the peak frequency were obtained.

When a radiation amount is calculated on the basis of the above idea, the radiation amount from a printed circuit board, which depends on the position of a signal interconnection, can be grasped at the stage of board design. In addition, the radiation amount from a printed circuit board can be more accurately predicted as compared to a prior art which considers only DM radiation from a signal interconnection. Furthermore, a printed circuit board with suppressed electromagnetic radiation can be more accurately designed on the basis of the more accurately obtained radiation amount.

DESCRIPTION OF THE PREFERRED EMBODIMENT

The embodiment of the present invention will be described next with reference to the accompanying drawings.

Figure 1:
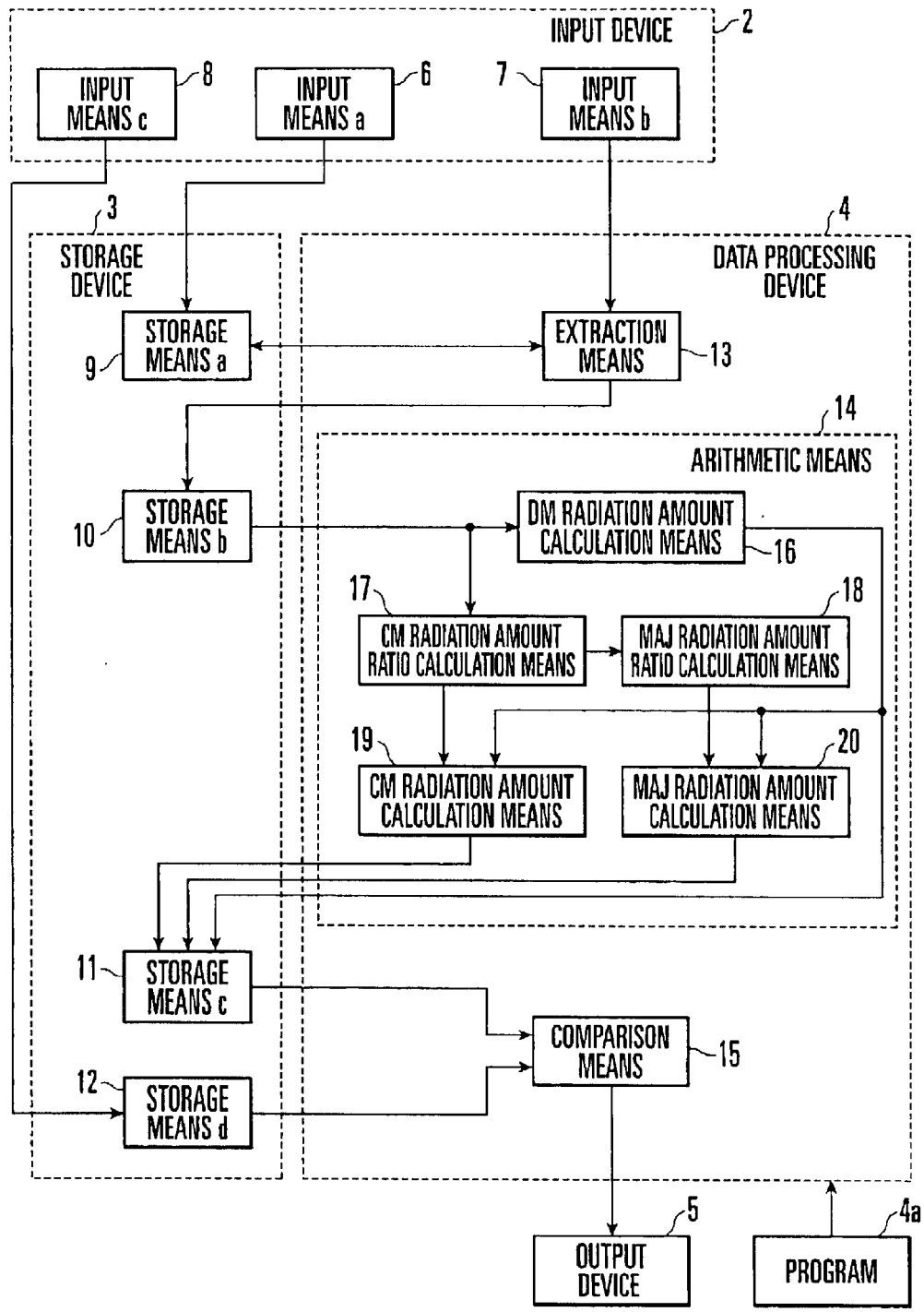
FIG. 1 is a block diagram showing the arrangement of a printed circuit board design support apparatus according to an embodiment of the present invention.

FIG. 1 shows the arrangement of a printed circuit board design support apparatus according to an embodiment of the present invention.

A printed circuit board design support apparatus 1 calculates the radiation amount of electromagnetic radiation which occurs due to an interconnection of a printed circuit board on the basis of design information related to a printed circuit board having a ground plane, interconnections formed on the printed circuit board, and components to be mounted on the printed circuit board, thereby supporting design of a printed circuit board. The printed circuit board design support apparatus 1 is constituted by an input device 2, storage device 3, data processing device 4, output device 5, and program 4a.

The input device 2 inputs various kinds of information necessary for calculating the radiation amount. The input device 2 has an input means a 6 for inputting pieces of design information related to a board, components, and interconnections, including the outer size and layer structure of a printed circuit board and the shape, position, and electric constant of each component or interconnection, an input means b 7 for inputting an interconnection name to designate an interconnection whose electromagnetic radiation amount is to be calculated, and an input means c 8 for inputting a limit value that is common to interconnections and indicates the limit of a major radiation amount generated by each interconnection.

The storage device 3 stores various kinds of information necessary for calculating the radiation amount. The storage device 3 has a storage means a 9 for storing pieces of design information related to the board, components, and interconnections, which are input by the input means a 6, a storage means b 10 for storing design information which is extracted, by an extraction means 13 (to be described later), from the storage means 9 on the basis of the interconnection name input by the input means b 7 and related to an interconnection whose electromagnetic radiation amount is to be calculated, a storage means c 11 for storing a major radiation amount, CM radiation amount, and DM radiation amount as calculation results of an arithmetic means 14 (to be described later), and a storage means d 12 for storing the limit value of the major radiation amount generated by each interconnection, which is input by the input means c 8.

The data processing device 4 is formed from a computer as a whole. Hardware resources including a microprocessor such as a CPU and its peripheral circuits and the program 4a are cooperated to calculate a desired radiation amount on the basis of various kinds of information input by the input device 2 and various kinds of information stored in the storage device 3. The data processing device 4 has the extraction means 13 for extracting information of an interconnection whose electromagnetic radiation amount is to be calculated from the pieces of design information stored in the storage means a 9 on the basis of the interconnection name designated by the input means b 7 and outputting the result to the storage means b 10, the arithmetic means 14 for calculating the major radiation amount, CM radiation amount, and DM radiation amount of each interconnection on the basis of interconnection information stored in the storage means b 10 and outputting the result to the storage means c 11, and a comparison means 15 for comparing the arithmetic result stored in the storage means c 11 with the limit value of the major radiation amount stored in the storage means d 12 and outputting the comparison result to the output device 5 (to be described later).

The output device 5 outputs the result of the comparison means 15 to make a notification about whether the radiation amount of electromagnetic radiation from the printed circuit board satisfies a desired limit value.

The program 4a is loaded into the data processing device 4 to cause the computer to execute desired radiation amount calculation processing. The program 4a is stored in a recording medium such as a CD-ROM or flexible disk. The program 4a may be transferred in advance to the storage device 3 connected to the data processing device 4 or a data accumulation device (not shown) such as a hard disk and then loaded into the data processing device 4, as needed.

The arithmetic means 14 of the data processing device 4 has functional means for calculating the desired radiation amount. These functional means are implemented by cooperation between the hardware resources and the program 4a.

These functional means are a DM radiation amount calculation means 16 for calculating a differential mode radiation amount (to be referred to as a DM radiation amount hereinafter) of electromagnetic radiation caused by an interconnection formed on a printed circuit board, a CM radiation amount ratio calculation means 17 for calculating a CM radiation amount ratio (CM/DM) that indicates the ratio of a common mode radiation amount (to be referred to as a CM radiation amount hereinafter) of electromagnetic radiation caused by the ground plane of the printed circuit board in correspondence with the interconnection to the DM radiation amount, an MAJ radiation amount ratio calculation means 18 for calculating an MAJ radiation amount ratio (MAJ/DM) that indicates the ratio of a major radiation amount (to be referred to as an MAJ radiation amount hereinafter) of entire electromagnetic radiation caused by the interconnection to the DM radiation amount, a CM radiation amount calculation means 19 for calculating a CM radiation amount from the CM radiation amount ratio and DM radiation amount, and an MAJ radiation amount calculation means 20 for calculating an MAJ radiation amount from the MAJ radiation amount ratio and DM radiation amount.

Figure 2:
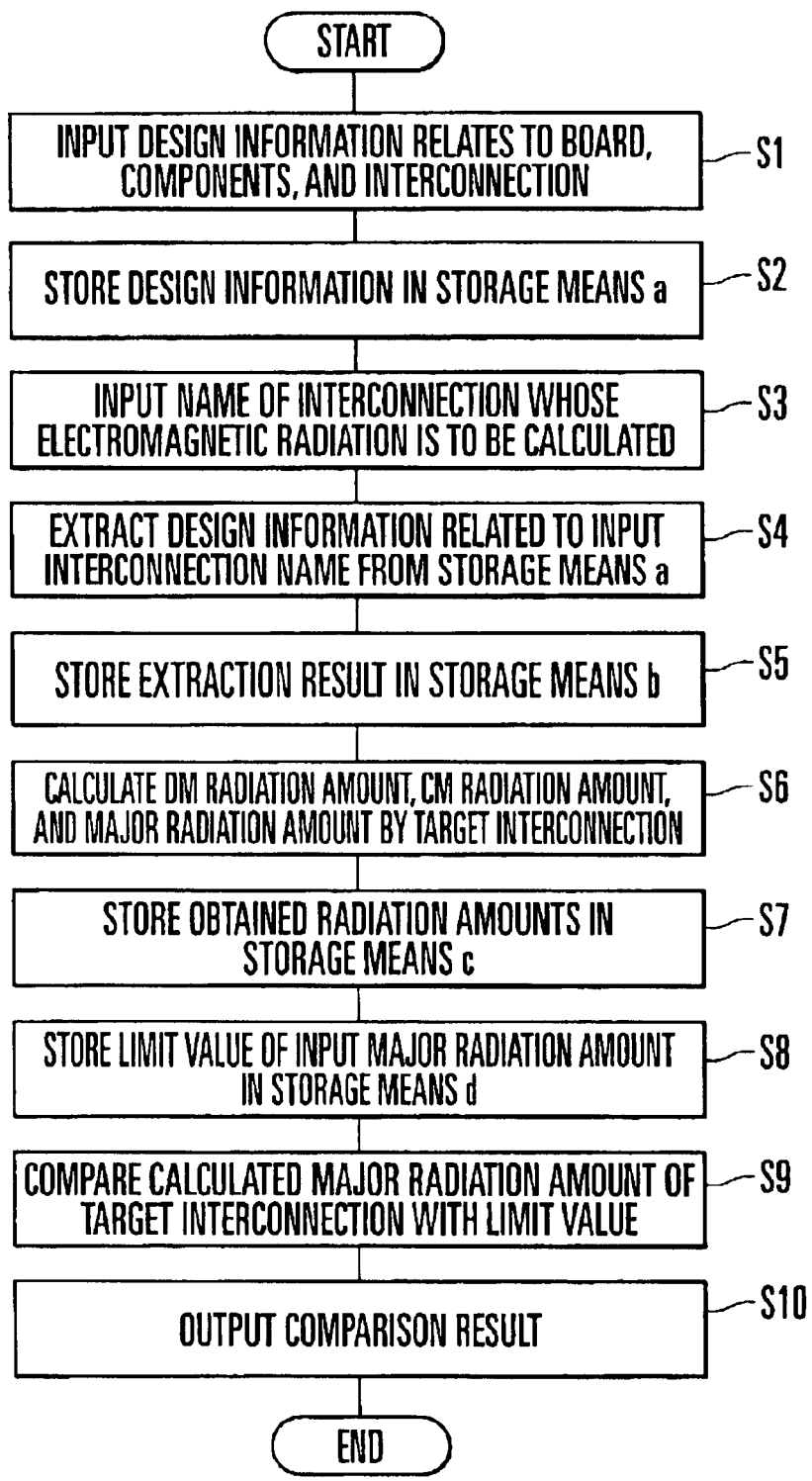
FIG. 2 is a flow chart for explaining the operation of the printed circuit board design support apparatus shown in FIG. 1.

The operation of the printed circuit board design support apparatus according to this embodiment will be described next with reference to FIG. 2. FIG. 2 shows the operation of the printed circuit board design support apparatus of this embodiment.

(S1) The input means a 6 inputs, to the apparatus 1, pieces of design information related to a board, components, and interconnections.

(S2) The storage means a 9 stores these pieces of information.

(S3) The input means b 7 inputs the name of an interconnection whose electromagnetic radiation is to be calculated.

(S4) The extraction means 13 extracts, from the storage means a 9, interconnection information corresponding to the interconnection name and board and component information related to the interconnection.

(S5) The storage means b 10 stores the extraction result.

(S6) The arithmetic means 14 calculates a major radiation amount, CM radiation amount, and DM radiation amount by the target interconnection on the basis of the information stored in the storage means b 10.

(S7) The storage means c 11 stores the calculated radiation amounts.

(S8) The input means c 8 inputs the major radiation amount limit value that is common to interconnections. The storage means d 12 stores the limit value.

(S9) The comparison means 15 compares the major radiation amount calculation result stored in the storage means c 11 with the major radiation amount limit value stored in the storage means d 12.

(S10) The comparison result and the major radiation amount, CM radiation amount, and DM radiation amount of each interconnection are output to the output device 5, thus ending the operation.

More specifically, the pieces of design information input in (S1) include the information of outer sizes, layer structures, and positions of the board, components, and interconnections, information of the board material, and electric circuit information of each component. As the information of outer size, layer structure, and position of each of the board, components, and interconnections, the name and X-, Y-, and Z-coordinate data at each apex of each object are input. With this operation, the size of the ground plane is also input. As the information of the board material, the material name and values such as the relative permittivity, relative permeability, and conductivity of the material are input.

As the electric circuit information of a passive component, the component name, the terminal names, the resistance value inductance value, capacitance value, and conductance value between the terminals are input. As the electric circuit information of an active component, the component name, the terminal names, the current vs. voltage characteristic at each terminal, and the rise/fall time, amplitude, pulse width, and duty ratio of an output waveform are input.

To extract the information of the interconnection whose electromagnetic radiation is to be calculated and the information of the board and components related to the interconnection in (S3) and (S4), more specifically, for example, a keyboard may be used as the input means b 7, and the name of the interconnection to be subjected to calculation may be input by the keyboard. The information of the board, components, and interconnections related to the interconnection may be extracted from the storage means a 9 by the extraction means 13. Alternatively, a search function may be prepared in the extraction means 13 to search for an interconnection name including a character string such as "CLK" from the pieces of interconnection information stored in the storage means a 9 and extract design information related to the interconnection. Alternatively, a display device and mouse may be used as the input device. The design information stored in the storage means a 9 may be displayed on the display device as a 2D or 3D drawing. The name of an interconnection to be subjected to calculation may be input by pointing that interconnection in the drawing, and design information related to that interconnection may be extracted from the storage means a 9. The above methods may be combined.

Figure 3:
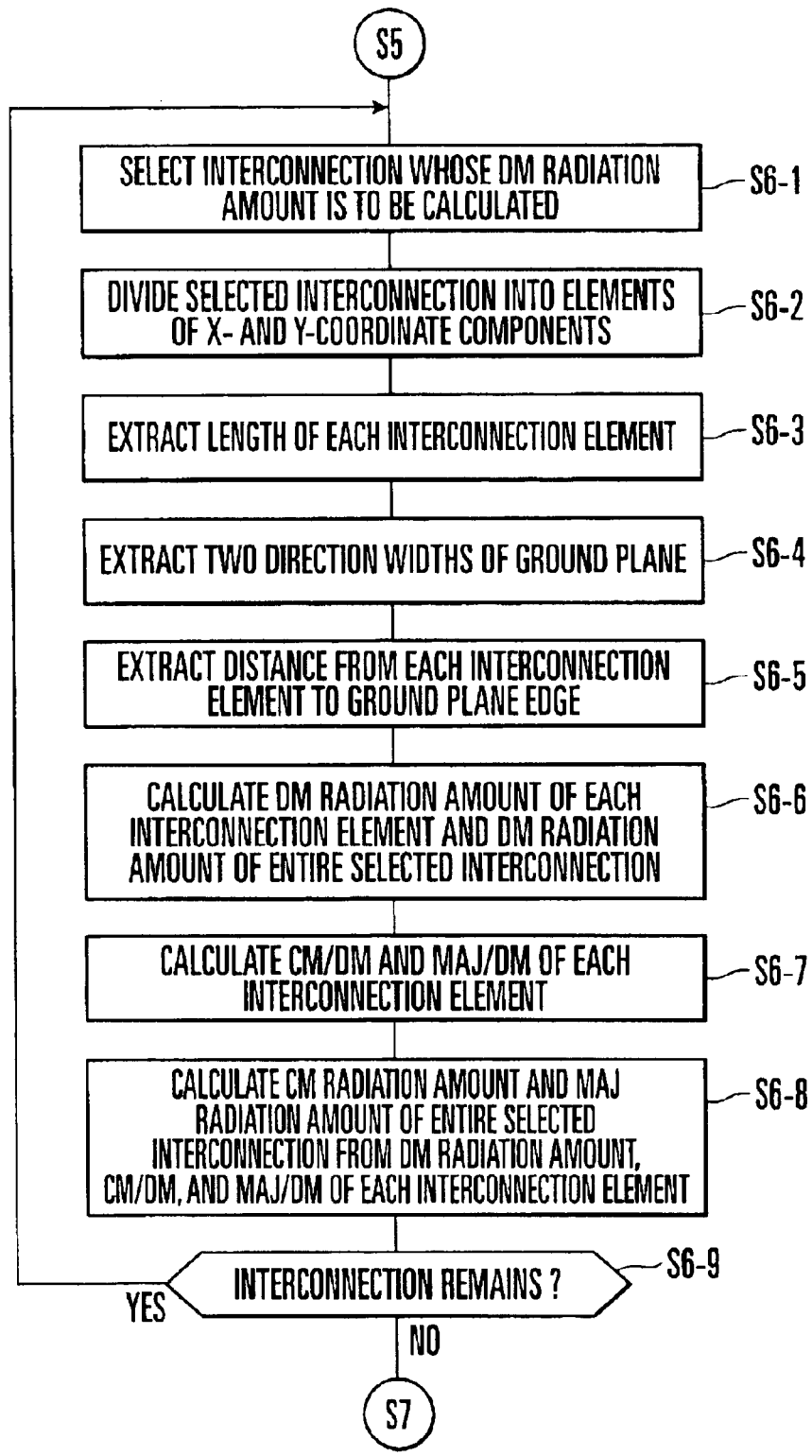
FIG. 3 is a flow chart for explaining step S6 shown in FIG. 2 in detail.
Figure 4:
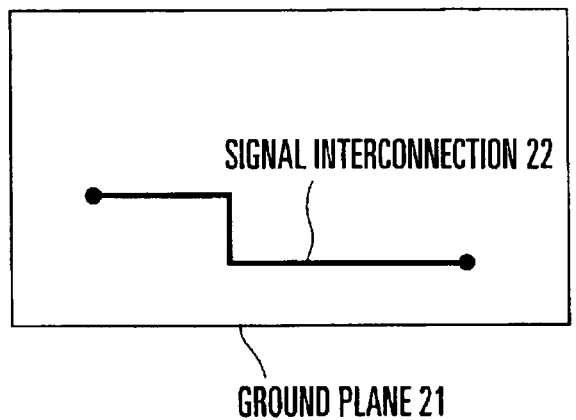
FIG. 4 is a view for explaining step S6-1 shown in FIG. 3 in detail.

Major radiation amount calculation processing in (S6) will be described next in detail with reference to FIGS. 3 and 4. FIG. 3 shows detailed operation in (S6). FIGS. 4 to 10 show the operation in (S6).

(S6-1) The DM radiation amount calculation means 16 selects an interconnection whose DM radiation amount is to be calculated from the interconnection information stored in the storage means b 10 and the information of the components and board related to the interconnection (FIG. 4). In the example shown in FIG. 4, information about a signal interconnection 22 formed in opposite to a ground plane 21 is selected.

Figure 5:
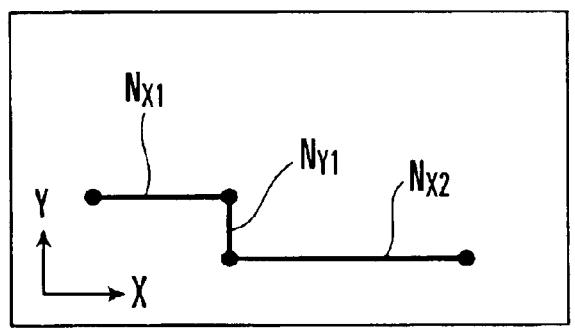
FIG. 5 is a view for explaining step S6-2 shown in FIG. 3 in detail.

(S6-2) This interconnection is divided into elements ($N_{X1}$, $N_{Y1}$, and $N_{X2}$) of X- and Y-coordinate components along two directions X and Y that are perpendicular to each other (FIG. 5). In the example shown in FIG. 5, the signal interconnection 22 shown in FIG. 4 is divided into X- and Y-coordinate components.

Figure 6:
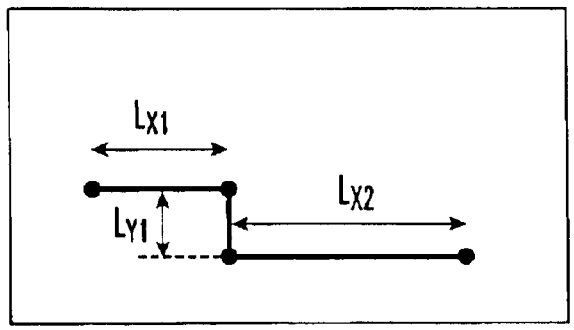
FIG. 6 is a view for explaining step S6-3 shown in FIG. 3 in detail.

(S6-3) The lengths ($L_{X1}$, $L_{Y1}$, and $L_{X2}$) of the elements are extracted (FIG. 6). In the example shown in FIG. 6, the lengths $L_{X1}$, $L_{Y1}$, and $L_{X2}$ of the elements $N_{X1}$, $N_{Y1}$, and $N_{X2}$ of X- and Y-coordinate components shown in FIG. 5 are extracted.

Figure 7:
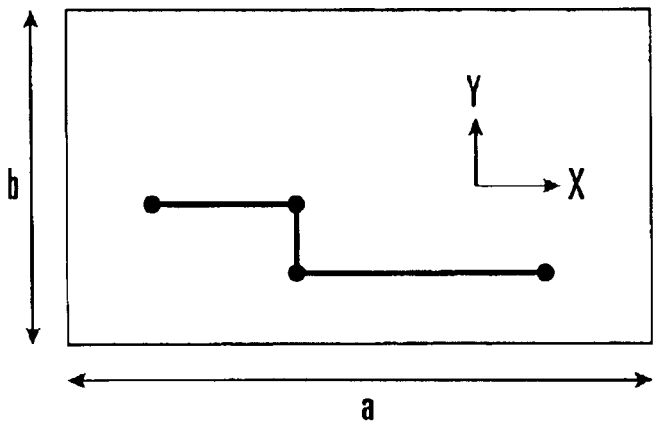
FIG. 7 is a view for explaining step S6-4 shown in FIG. 3 in detail.

(S6-4) Two direction widths (a and b) of the ground plane opposing the interconnection are extracted (FIG. 7). FIG. 7 shows the Y- and X-direction widths a and b of the ground plane 21 shown in FIG. 4.

Figure 8:
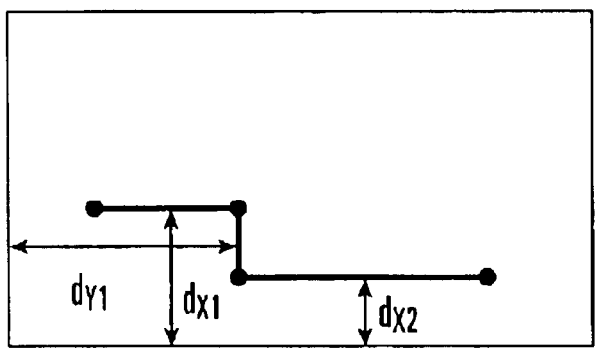
FIG. 8 is a view for explaining step S6-5 shown in FIG. 3 in detail.

(S6-5) Distances ($d_{X1}$, $d_{Y1}$, and $d_{X2}$) from the respective interconnection elements to ground plane edges parallel to those elements are extracted (FIG. 8). In the example shown in FIG. 8, the distances from the elements $N_{X1}$ and $N_{X2}$ of the signal interconnection 22 to the lower edge (lower side of the drawing) of the ground plane 21 are represented by $d_{X1}$ and $d_{X2}$, respectively. The distance from the element $N_{Y1}$ of the signal interconnection 22 to the left edge (left side of the drawing) of the ground plane 21 is represented by $d_{Y1}$.

Figure 9:
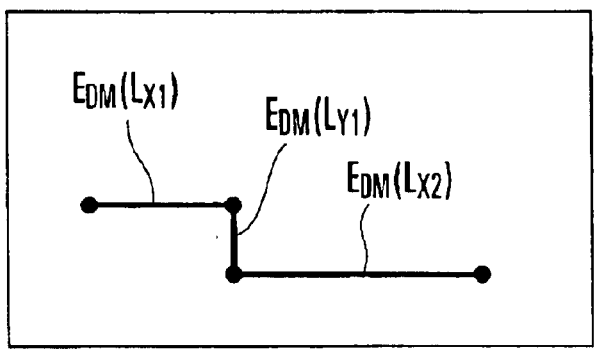
FIG. 9 is a view for explaining step S6-6 shown in FIG. 3 in detail.

(S6-6) The DM radiation amount calculation means 16 calculates DM radiation amounts ($E_{DM}(L_{X1})$, $E_{DM}(L_{Y1})$, and $E_{DM}(L_{X2})$) by the respective interconnection elements and obtains the DM radiation amount of the entire interconnection (FIG. 9). In the example shown in FIG. 9, the DM radiation amounts ($E_{DM}(L_{X1})$, $E_{DM}(L_{Y1})$, and $E_{DM}(L_{X2})$) are calculated for the elements $N_{X1}$, $N_{Y1}$, and $N_{X2}$ of the X- and Y-coordinate components shown in FIG. 5.

Figure 10:
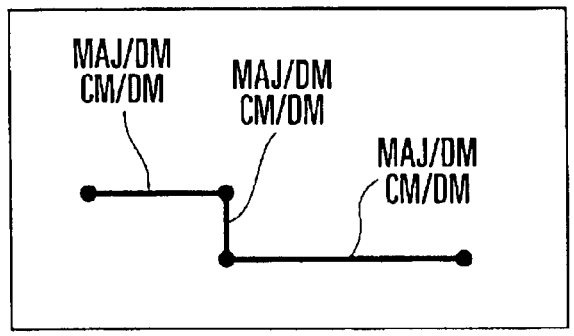
FIG. 10 is a view for explaining step S6-7 shown in FIG. 3 in detail.

(S6-7) The CM radiation amount ratio calculation means 17 calculates CM radiation amount ratios (CM/DM) of the respective interconnection elements. The MAJ radiation amount ratio calculation means 18 calculates the MAJ radiation amount ratios (MAJ/DM) of the respective interconnection elements (FIG. 10). In the example shown in FIG. 10, CM/DM and MAJ/DM are calculated for each of the elements $N_{X1}$, $N_{Y1}$, and $N_{X2}$ of the X- and Y-coordinate components shown in FIG. 5.

(S6-8) The CM radiation amount calculation means 19 calculates the CM radiation amount of each interconnection element from the DM radiation amount and CM/DM of the interconnection element, thereby obtaining the CM radiation amount of the entire interconnection. The MAJ radiation amount calculation means 20 calculates the MAJ radiation amount of each interconnection element from the DM radiation amount and MAJ/DM of the interconnection element, thereby obtaining the MAJ radiation amount of the entire interconnection.

(S6-9) If an interconnection whose radiation amount is to be calculated remains, the flow returns to (S6-1). If no interconnection remains, (S6) is ended.

Although an individual description is omitted, the DM radiation amount calculation means 16 of the present invention obtains the maximum value of the DM radiation amount of each interconnection element. The CM radiation amount ratio calculation means 17 obtains, as a CM radiation amount ratio, the ratio of the maximum value of a CM radiation amount to the maximum value of a DM radiation amount. The MAJ radiation amount ratio calculation means 18 also obtains, as an MAJ radiation amount ratio, the ratio of the maximum value of an MAJ radiation amount to the maximum value of a DM radiation amount. Hence, a DM radiation amount and major radiation amount calculated by the CM radiation amount calculation means 19 and MAJ radiation amount calculation means 20, respectively, also indicate maximum values.

The DM radiation amount calculation means 16 obtains the DM radiation amount ($E_{DM}(L,f)$) of each interconnection element in (S6-6) by $$E_{DM}(L, f) = 1.316 \times 10^{-14} \cdot \left[ \frac{L \cdot 2 \cdot h \cdot I(f) \cdot f^2}{r} \right] \quad (1)$$

where L is the length of an interconnection element, h is the height from the ground plane to the interconnection, r is the observation distance of the radiation amount, I(f) is the current value, and f is the frequency. The interconnection length L or interconnection height h can be extracted from the design information of the board. The observation distance r is basically 3 m or 10 m in accordance with the standard of electromagnetic radiation. This equation is known and introduced in, e.g., PROCEEDINGS OF 1987 IEEE INTERNATIONAL SYMPOSIUM ON ELECTROMAGNETIC COMPATIBILITY, "RADIATED EMIS- SIONS FROM COMMON-MODE CURRENTS." Various methods can be used to obtain the current value I(f). For example, the current is defined as a current at the output terminal of the transmitting-side IC of the signal interconnection and obtained by $$I(f) = \frac{V(f)}{Z(f)} \qquad (2)$$

where V(f) is the output voltage spectrum of the transmitting-side IC, and Z(f) is the input impedance on the receiving side when viewed from the output terminal of the transmitting IC.

The rectangular output voltage spectrum V(f) of the transmitting IC can be defined by $$V(n \cdot f_0) = 2 \cdot V \cdot duty \cdot \frac{\sin(n \cdot \pi \cdot duty)}{n \cdot \pi \cdot duty} \cdot \frac{\sin(n \cdot \pi \cdot t_r \cdot f_0)}{n \cdot \pi \cdot t_r \cdot f_0} \qquad (3)$$

where n is an integer, $f_0$ is the fundamental repetitive frequency of the voltage waveform, V is the amplitude of the voltage waveform, duty is the duty ratio of the voltage waveform, and $t_r$ is the rise/fall time of the voltage waveform.

The input impedance Z(f) on the receiving side when viewed from the output terminal of the transmitting IC is defined by $$Z(f) = Z_{out} + R_{damp} + Z_c \cdot \frac{Z_{load}(f) + j \cdot Z_c \cdot \tan[\beta(f) \cdot 1]}{Z_c + j \cdot Z_{load}(f) \cdot \tan[\beta(f) \cdot 1]} \qquad (4)$$

where $Z_{out}$ is the output impedance of the transmitting IC, $R_{damp}$ is the damping resistance connected in series to the damp transmitting IC, $Z_{load}$ is the load impedance of the receiving-side IC, $Z_c$ is the characteristic impedance of the interconnection, and β(f) is the phase constant in the signal interconnection.

When these equations are used, the interconnection current I(f) when a rectangular voltage waveform is input from the transmitting IC, and the DM radiation amount ($E_{DM}$(L, f)) at the distance r for the interconnection current can be obtained.

The MAJ/DM and CM/DM of each interconnection element, which are obtained by the MAJ radiation amount ratio calculation means 18 and CM radiation amount ratio calculation means 17 in (S6-7), are the values of MAJ/DM and CM/DM at frequencies at which the MAJ/DM characteristic and CM/DM characteristic of each interconnection element exhibit their peak values. Let a be the width of the ground plane opposing each interconnection element in a direction parallel to the interconnection element, and b be the width in a direction perpendicular to the interconnection element. The MAJ/DM can be obtained as a function of the widths a and b and the distance d from the ground plane edge to the interconnection element by $$MAJ/DM(a,b,d) = 1 + CM/DM(a,b,d) \qquad (5)$$

Figure 14:
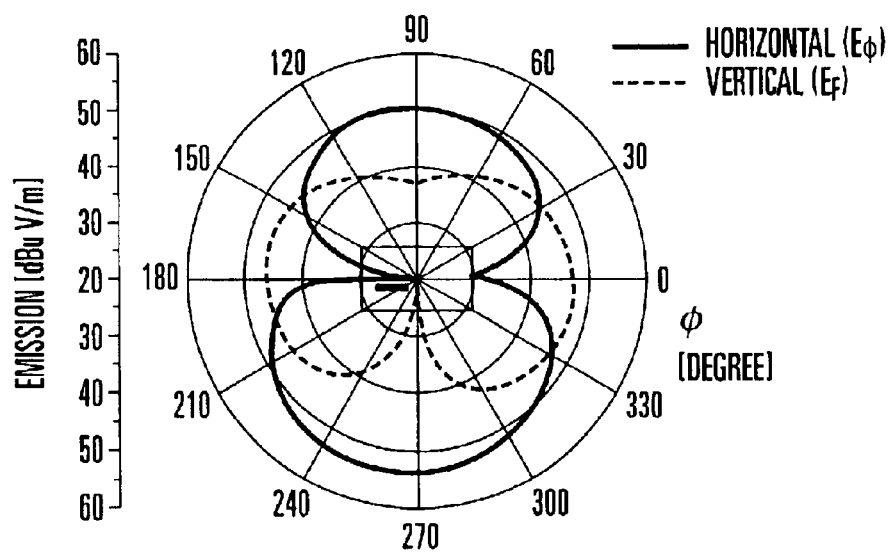
FIG. 14 is a schematic view showing a radiation pattern when a board surface is arranged horizontally.
Figure 14:
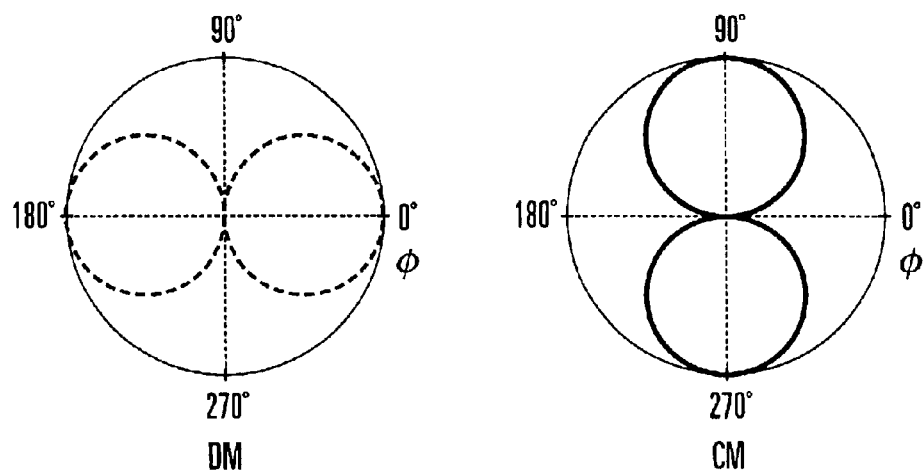
Figure 15:
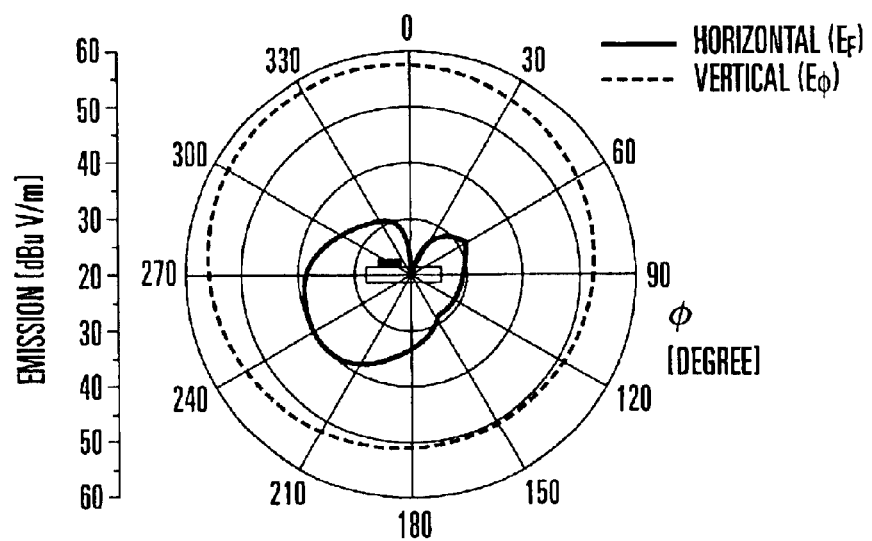
FIG. 15 is a schematic view showing a radiation pattern when a board long side is arranged vertically.
Figure 15:
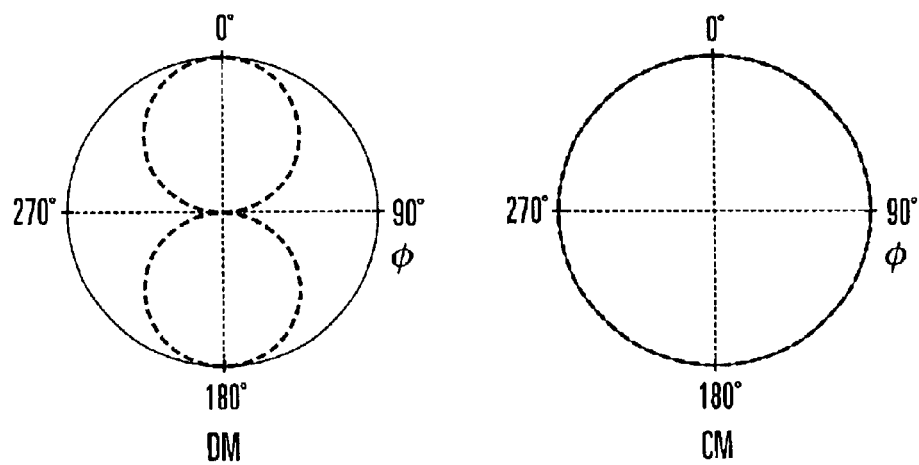
Figure 16:
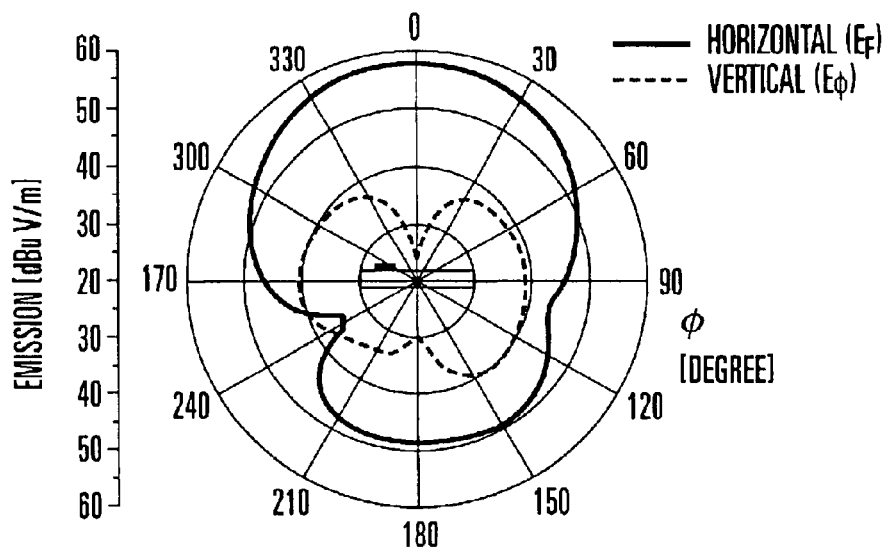
FIG. 16 is a schematic view showing a radiation pattern when a board short side is arranged vertically.
Figure 16:
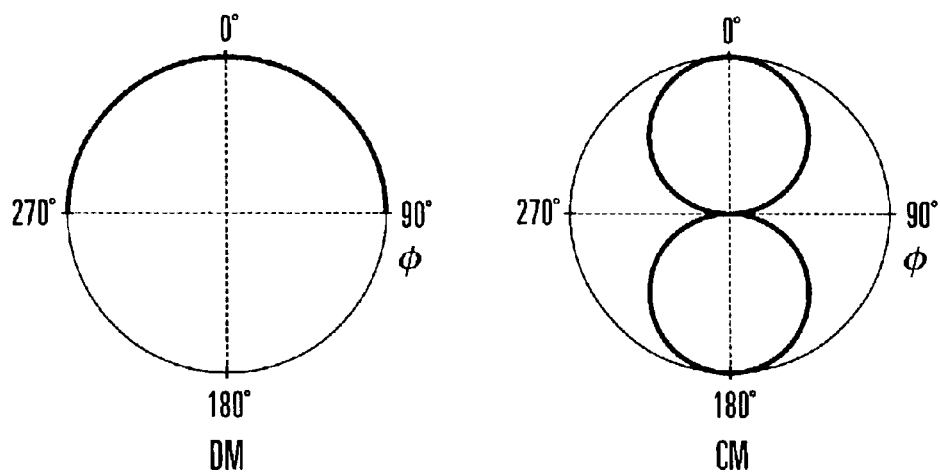
Figure 17:
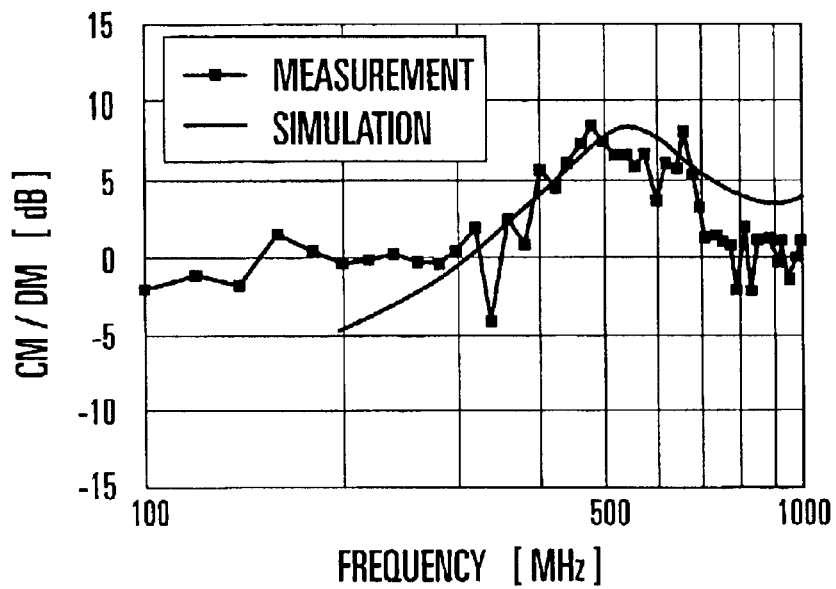
FIG. 17 is a graph showing the frequency characteristic of CM/DM.
Figure 18:
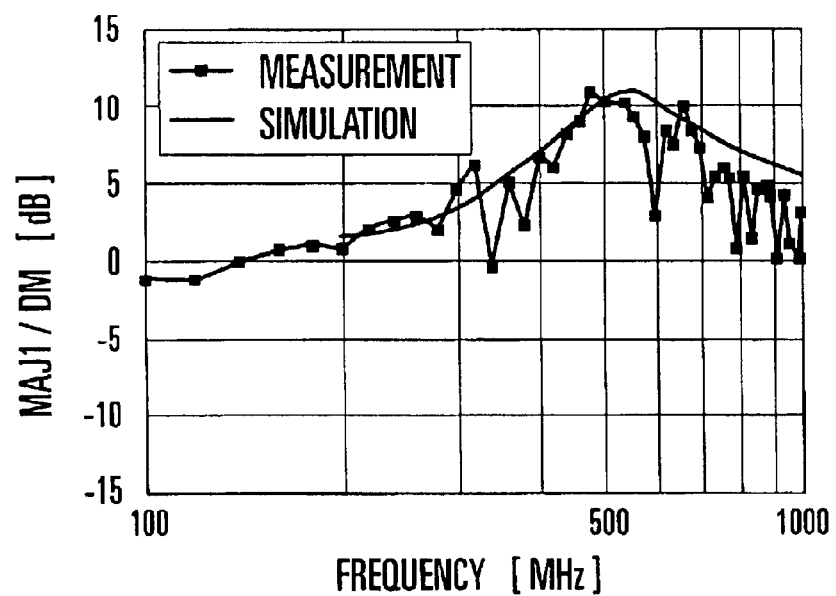
FIG. 18 is a graph showing the frequency characteristic of MAJ/DM.
Figure 19:
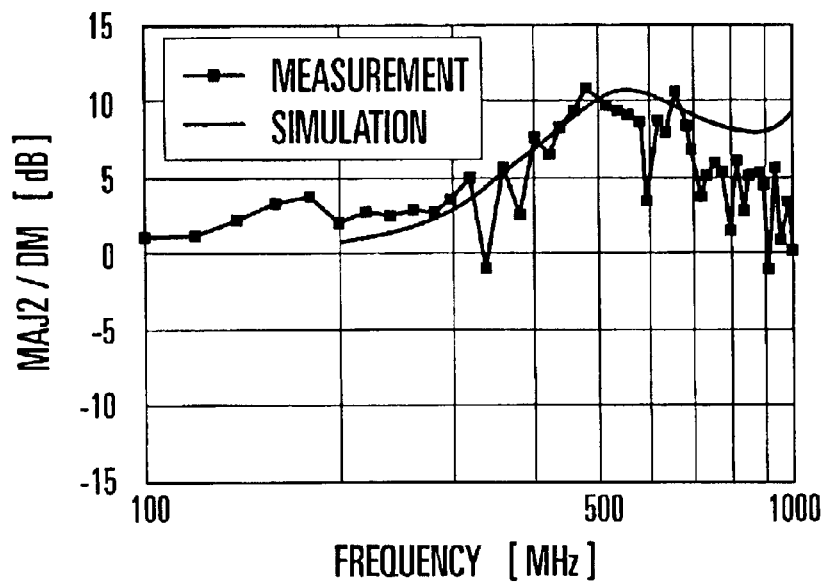
FIG. 19 is a graph showing the frequency characteristic of MAJ/DM.
Figure 20:
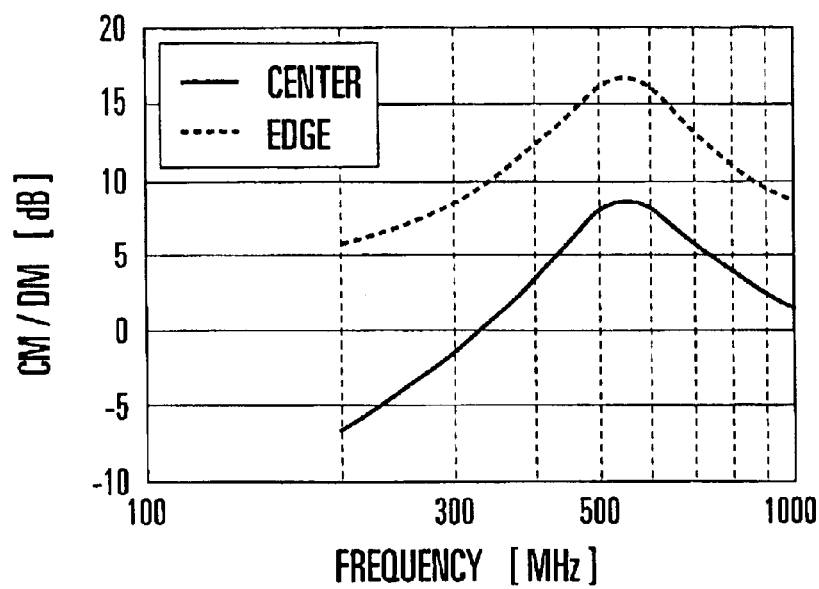
FIG. 20 is a graph showing the position dependence of CM/DM.

This equation indicates that the maximum (MAJ) radiation amount can be represented by a simple sum of the DM radiation amount and CM radiation amount. The present inventor found this relationship on the basis of the results shown in FIGS. 14 to 16 described above.

CM/DM(a,b,d) can be obtained by $$CM/DM(a,b,d) = 10^{\frac{y_0(a,b) + 0.35 \cdot \exp\left[\frac{1-d}{t(a,b)}\right]}{20}} \qquad (6)$$

Figure 21:
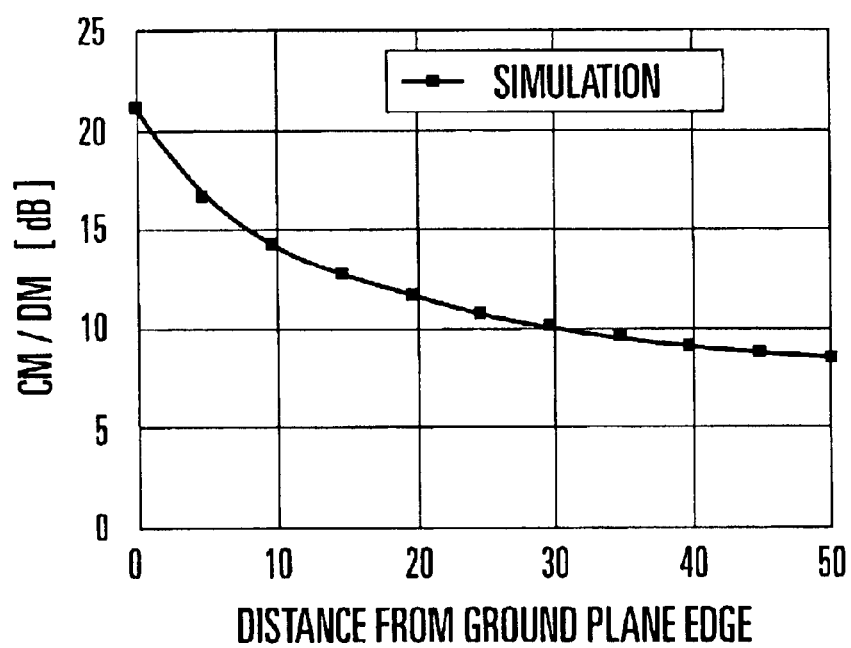
FIG. 21 is a graph showing the position dependence of CM/DM.
Figure 22:
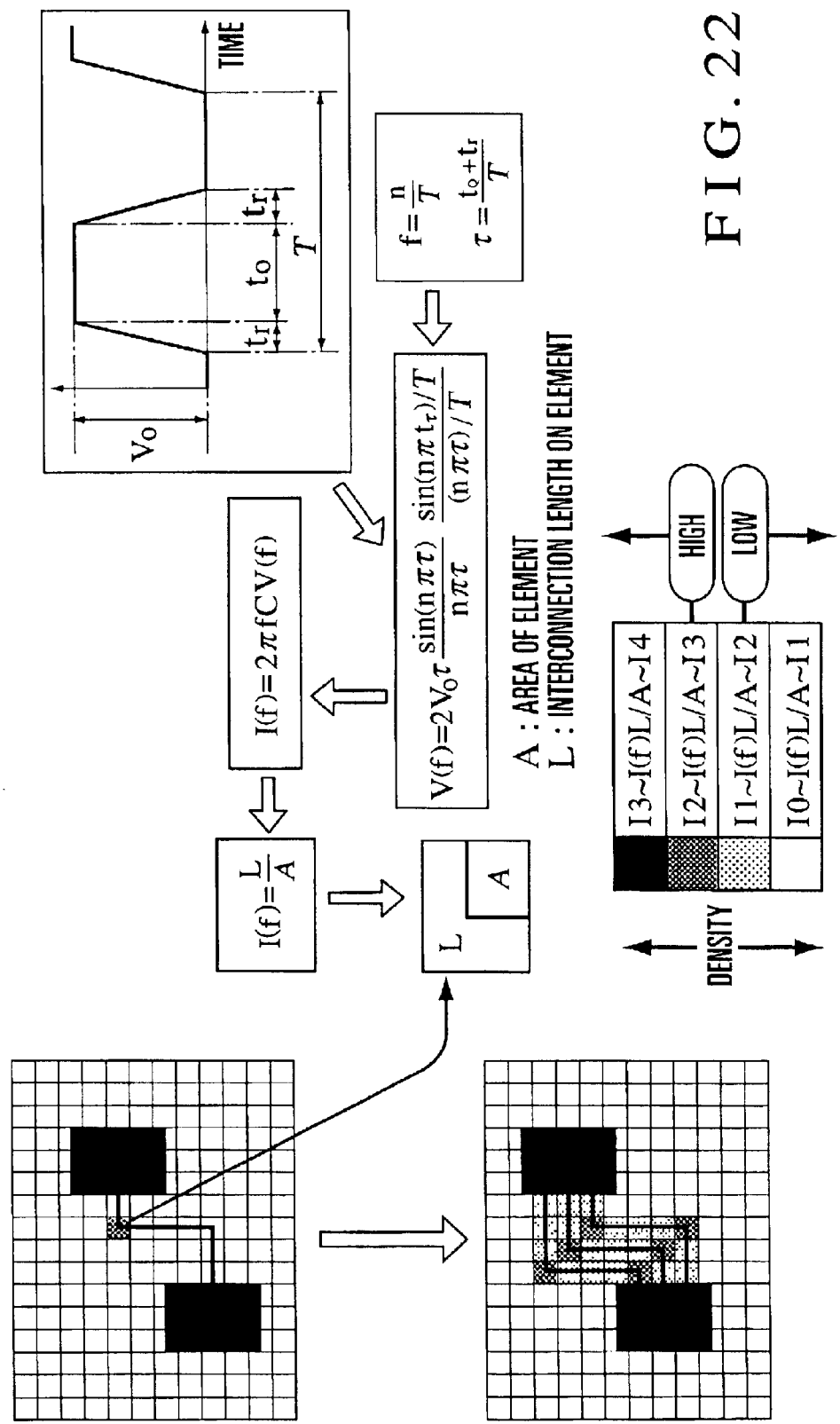
FIG. 22 is a view for explaining a prior art.
Figure 23:
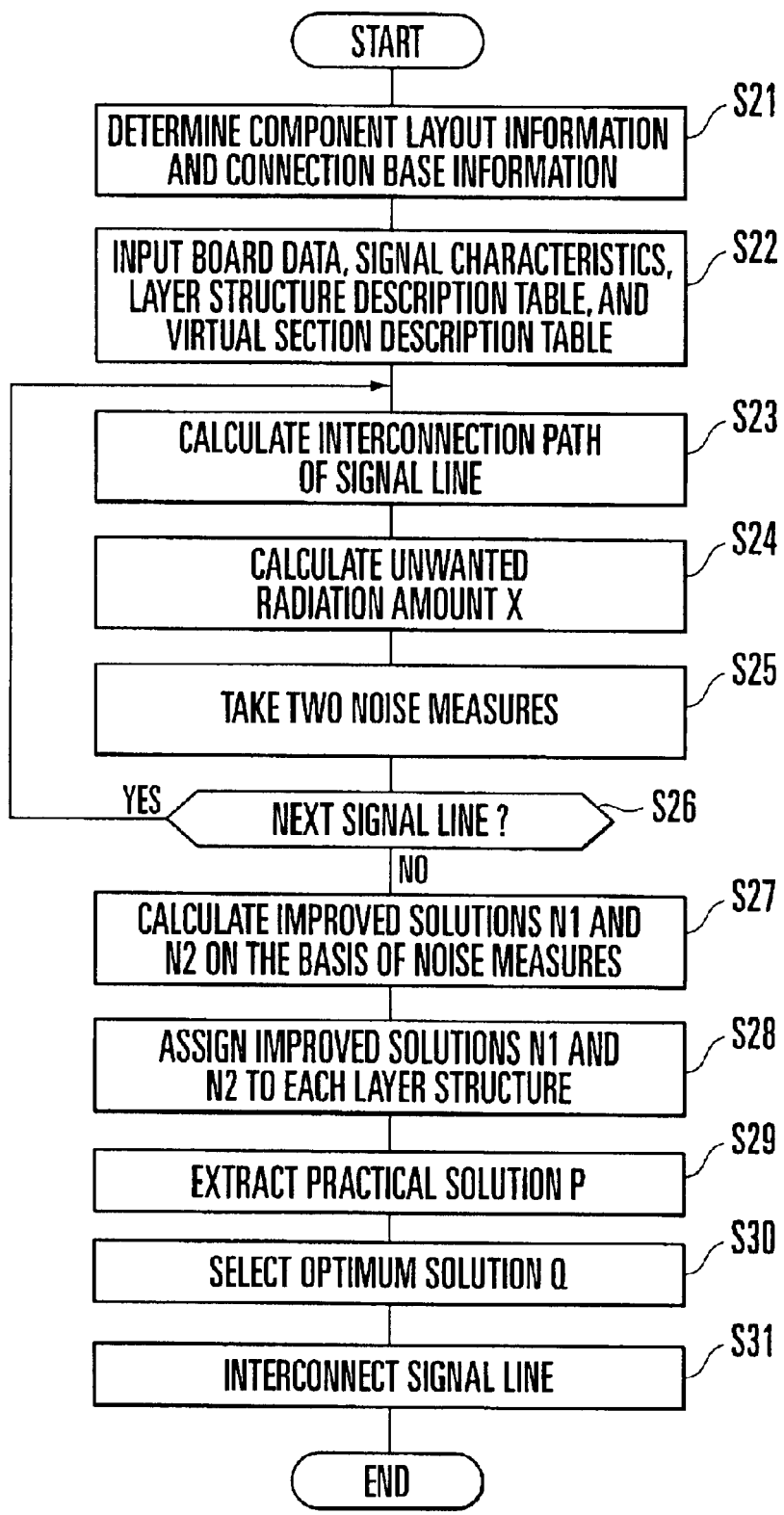
FIG. 23 is a view for explaining another prior art.
Figure 24:
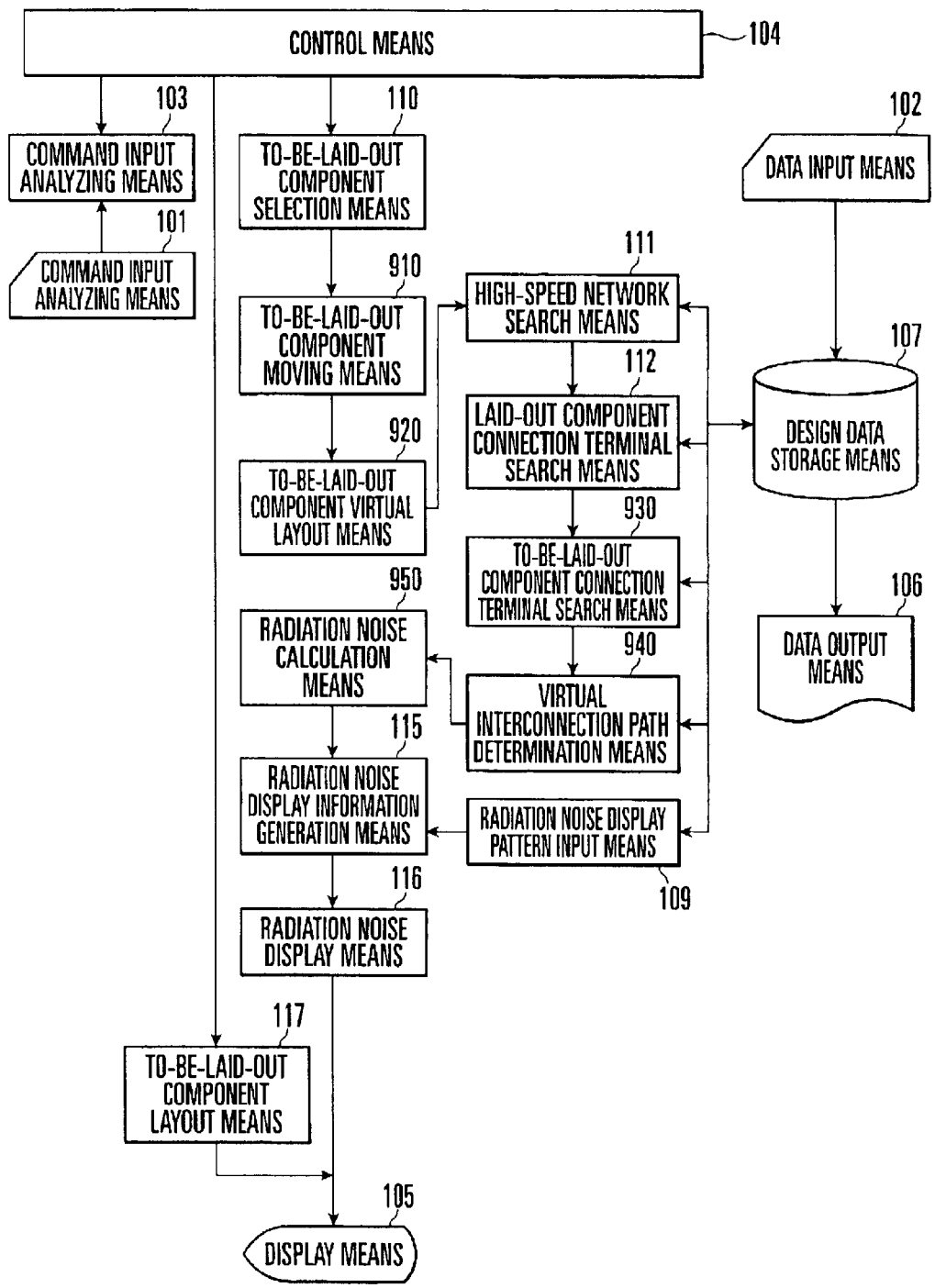
FIG. 24 is a view for explaining still another prior art.

This equation indicates that as the distance between the interconnection and the ground plane edge decreases, the value of CM/DM exponentially increases. This relationship is expressed by an exponential function because a result in which the ratio of CM/DM exponentially rises as the distance between the interconnection pattern and the ground plane edge decreases was obtained by measurements and electromagnetic field simulation, as shown in FIG. 21 described above or is indicted by electromagnetic field simulation results shown in FIGS. 11 and 12 (to be described later). This equation is represented by a factorial of 10 to linearly change dB.

In addition, $y_0(a,b)$ and $t(a,b)$ are given by $$y_0(a,b) = 0.57 + 24.47 \cdot \log\left(\frac{a}{b}\right) - 3.83 \cdot \left[\log\left(\frac{a}{b}\right)\right]^2 \qquad (7)$$

$$t(a,b) = 0.26 + 0.01 \cdot \left(\frac{a}{b}\right) \qquad (8)$$

where $y_0(a,b)$ is the value of CM/DM [dB] when the interconnection is laid out at the center of the ground plane, which is determined by the widths a and b of the ground plane, and t(a,b) is a coefficient that determines the gradient of the exponential function given by equation (6), which is also determined by the widths a and b. Equations (7) and (8) were written on the basis of the results shown in FIGS. 11 and 12 (to be described later). The present inventor found that if the aspect ratio (a/b) of the ground plane is kept unchanged, the ratio CM/DM at the center of the ground plane does not change.

The CM radiation amount calculation means 19, MAJ radiation amount calculation means 20, and DM radiation amount calculation means 16 obtain the major radiation amount, CM radiation amount, and major radiation amount in (S6-8) by $$E_{CM} = \sum CM/DM(a,b,d) \cdot E_{DM}(L) \qquad (9)$$

$$E_{MAJ} = \sum MAJ/DM(a,b,d) \cdot E_{DM}(L) \qquad (10)$$

$$E_{DM} = \sum E_{DM}(L) \qquad (11)$$

The radiation amounts $E_{MAJ}$, $E_{CM}$, and $E_{DM}$ are obtained for each of X- and Y-coordinates. $E_{DM}(L)$ is the value at the frequency f at which $E_{DM}(L,f)$ is maximized.

The comparison method in (S9) will be described next. In (S6), the major radiation amount is calculated for each of the X- and Y-coordinates. A large value of the major radiation amounts is compared with the limit value stored in the storage means d 12.

As the result output method in (S10), for example, an output device having a display device is used to display the major radiation amount of electromagnetic radiation caused by each interconnection, the CM radiation amount from the ground plane, and the DM radiation amount from each interconnection itself. Alternatively, interconnections are listed in descending order of major radiation amount, CM radiation amount, or DM radiation amount, and the three kinds of radiation amounts are displayed for each interconnection. Alternatively, the pieces of position information of the board, components, and interconnections of the printed circuit board are displayed on the display device as a 2D or 3D structure, and interconnections whose radiation amounts are calculated are classified by colors in accordance with the radiation amount level and displayed. These methods may be combined.

Figure 11:
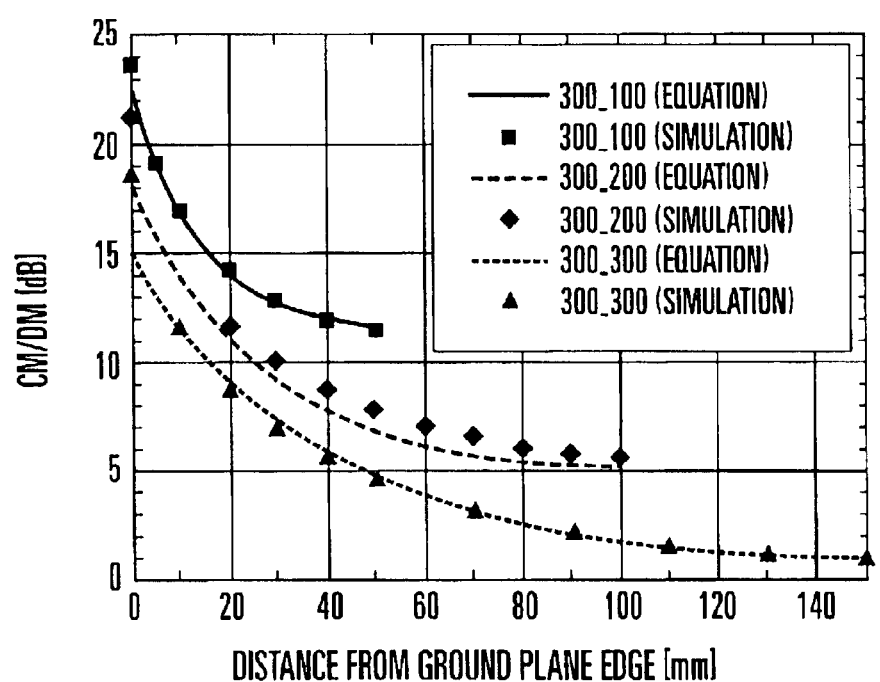
FIG. 11 is a graph showing a comparison result between an electromagnetic field simulation result and a calculation result by the printed circuit board design support apparatus shown in FIG. 1.
Figure 12:
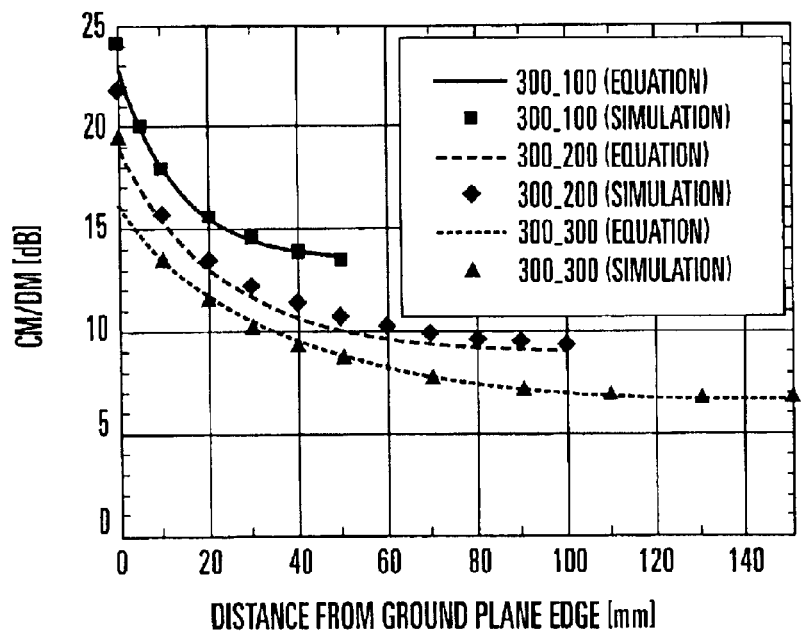
FIG. 12 is a graph showing a comparison result between an electromagnetic field simulation result and a calculation result by the printed circuit board design support apparatus shown in FIG. 1.
Figure 13:
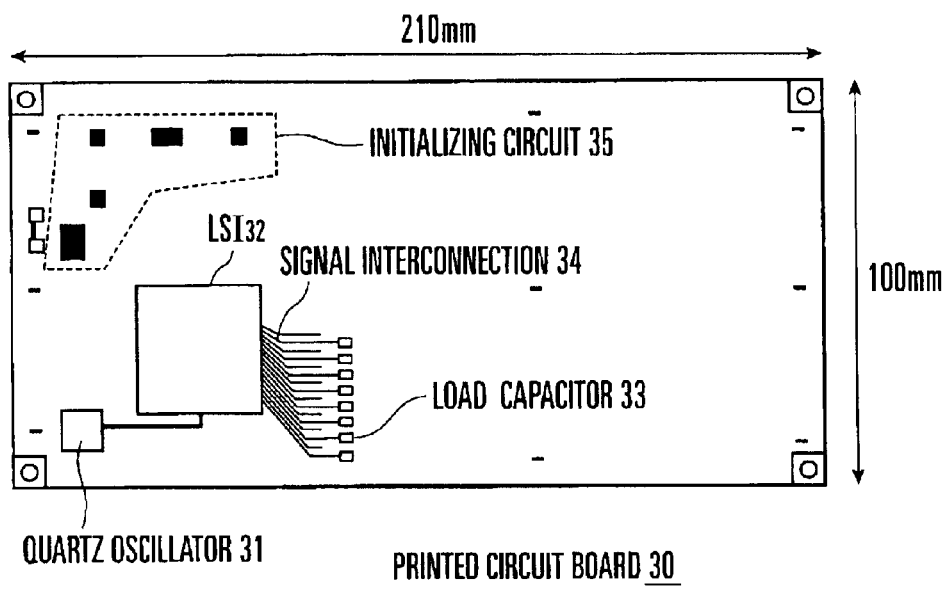
FIG. 13 is a schematic view showing a printed circuit board which can be applied to the present invention.

FIG. 11 shows the interconnection position dependence of CM/DM. FIG. 12 shows the interconnection position dependence of MAJ/DM. Referring to FIGS. 11 and 12, "equation" indicates a result calculated using equations (5) to (8), and "simulation" indicates a result obtained by electromagnetic field simulation. Calculation conditions for electromagnetic field simulation are the same as in FIGS. 17 to 21 described above.

The results were obtained by calculation for ground planes having sizes of 300 mm×100 mm, 300 mm×200 mm, and 300 mm×300 mm. As is apparent from FIGS. 11 and 12, the calculation results and simulation results satisfactorily match for both CM/DM and MAJ/DM at positions other than those immediately above a ground plane edge, although slight differences are present immediately above the ground plane edge. The calculation time of electromagnetic field simulation was about 48 hrs for each point while the time was 1 sec or less for each point when the equations were used.

As has been described above, in the present invention, a common mode (CM) radiation amount is calculated on the basis of a CM radiation amount ratio that indicates the ratio of a common mode (CM) radiation amount of electromagnetic radiation caused by a ground plane in correspondence with an interconnection to a differential mode (DM) radiation amount of electromagnetic radiation caused by the interconnection. Hence, the radiation amount of electromagnetic radiation that occurs due to an interconnection of a printed circuit board can easily be calculated in a short time without executing electromagnetic field simulation, unlike prior arts.

In addition, as a major (MAJ) radiation amount that indicates the major radiation amount of entire electromagnetic radiation caused by an interconnection of a printed circuit board, a radiation amount corresponding to the sum of a differential mode (DM) radiation amount and common mode (CM) radiation amount is calculated. As compared to the prior art in which only a differential mode (DM) radiation amount is handled, the radiation amount of electromagnetic radiation can be accurately calculated for each interconnection. Hence, interconnections with suppressed electromagnetic radiation can easily be designed in a short time.

What is claimed is:

1. A printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising:

arithmetic means for calculating a common mode (CM) radiation amount of the interconnection on the basis of a CM radiation amount ratio that indicates a ratio of a common mode (CM) radiation amount of electromagnetic radiation caused by the ground plane in correspondence with the interconnection to a differential mode (DM) radiation amount of electromagnetic radiation caused by the interconnection.

2. An apparatus according to claim 1, wherein said arithmetic means calculates, as a major (MAJ) radiation amount that indicates a major radiation amount of electromagnetic radiation caused by the interconnection, a radiation amount corresponding to a sum of the differential mode (DM) radiation amount and common mode (CM) radiation amount of the interconnection.

3. An apparatus according to claim 2, wherein said arithmetic means calculates the major (MAJ) radiation amount of the interconnection on the basis of an MAJ radiation amount ratio that indicates a ratio of the major (MAJ) radiation amount to the differential mode (DM) radiation amount of the interconnection.

4. An apparatus according to claim 3, wherein said arithmetic means comprises

DM radiation amount calculation means for calculating the differential mode (DM) radiation amount of the interconnection on the basis of the design information, CM radiation amount ratio calculation means for calculating the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, MAJ radiation amount ratio calculation means for calculating an MAJ radiation amount ratio that indicates a ratio of the major (MAJ) radiation amount to the differential mode (DM) radiation amount of the interconnection on the basis of the CM radiation amount ratio calculated by said CM radiation amount ratio calculation means, and MAJ radiation amount calculation means for calculating the major (MAJ) radiation amount of the interconnection on the basis of the MAJ radiation amount ratio calculated by said MAJ radiation amount ratio calculation means and the differential mode (DM) radiation amount calculated by said DM radiation amount calculation means.

5. An apparatus according to claim 4, wherein said arithmetic means comprises CM radiation amount calculation means for calculating the common mode (CM) radiation amount of the interconnection on the basis of the CM radiation amount ratio calculated by said CM radiation amount ratio calculation means and the differential mode (DM) radiation amount calculated by said DM radiation amount calculation means.

6. An apparatus according to claim 3, wherein said arithmetic means comprises

DM radiation amount calculation means for calculating the differential mode (DM) radiation amount of the interconnection on the basis of the design information, CM radiation amount ratio calculation means for, letting a be a width of the ground plane opposing the interconnection in a direction parallel to the interconnection, b be a width in a direction perpendicular to the interconnection, and d be a distance from an edge of the ground plane to the interconnection, calculating the CM radiation amount ratio CM/DM(a,b,d) that indicates the ratio of the common mode (CM) radiation amount to the differential mode (DM) radiation amount of the interconnection by $$CM/DM(a,b,d) = 10^{\frac{y_0(a,b)+0.35\cdot\exp\left[\frac{1-d}{t(a,b)}\right]}{20}}$$

$$y_0(a,b) = 0.57 + 24.47\cdot\log\left(\frac{a}{b}\right) - 3.83\cdot\left[\log\left(\frac{a}{b}\right)\right]^2$$

$$t(a,b) = 0.26 + 0.01\cdot\left(\frac{a}{b}\right),$$

MAJ radiation amount ratio calculation means for calculating an MAJ radiation amount ratio MAJ/DM(a,b,d) that indicates a ratio of the major (MAJ) radiation amount to the differential mode (DM) radiation amount of the interconnection on the basis of the CM radiation amount ratio CM/DM(a,b,d) calculated by said CM radiation amount ratio calculation means by $$MAJ/DM(a,b,d)=1+CM/DM(a,b,d),$$

CM radiation amount calculation means for calculating the common mode (CM) radiation amount of the interconnection on the basis of the CM radiation amount ratio calculated by said CM radiation amount ratio calculation means and the differential mode (DM) radiation amount calculated by said DM radiation amount calculation means, and MAJ radiation amount calculation means for calculating the major (MAJ) radiation amount of the interconnection on the basis of the MAJ radiation amount ratio calculated by said MAJ radiation amount ratio calculation means and the differential mode (DM) radiation amount calculated by said DM radiation amount calculation means.

7. An apparatus according to claim 6, wherein said DM radiation amount calculation means calculates the differential mode (DM) radiation amount of the entire interconnection by calculating a differential mode (DM) radiation amount $E_{DM}(L)$ letting L be a length of each of a plurality of interconnection elements obtained by dividing the interconnection along two directions perpendicular to each other, and adding the differential mode (DM) radiation amounts $E_{DM}(L)$, said CM radiation amount ratio calculation means calculates the CM radiation amount ratio CM/DM(a,b,d) for each interconnection element, said MAJ radiation amount ratio calculation means calculates the MAJ radiation amount ratio MAJ/DM(a,b,d) for each interconnection element, said CM radiation amount calculation means calculates the common mode (CM) radiation amount of the entire interconnection on the basis of the differential mode (DM) radiation amount $E_{DM}(L)$ and MAJ radiation amount ratio MAJ/DM(a,b,d) of each interconnection element by $$E_{CM} = \sum CM/DM(a,b,d)\cdot E_{DM}(L), \text{ and}$$

said MAJ radiation amount calculation means calculates the major (MAJ) radiation amount of the entire interconnection on the basis of the differential mode (DM) radiation amount $E_{DM}(L)$ and MAJ radiation amount ratio MAJ/DM(a,b,d) of each interconnection element by $$E_{MAJ} = \sum MAJ/DM(a,b,d)\cdot E_{DM}(L)$$

8. An apparatus according to claim 2, further comprising comparison means for comparing the major (MAJ) radiation amount of the interconnection, which is calculated by said arithmetic means, with a limit value that indicates a desired limit of the radiation amount of the interconnection and outputting a comparison result.

9. An apparatus according to claim 1, wherein said arithmetic means comprises

DM radiation amount calculation means for calculating the differential mode (DM) radiation amount of the interconnection on the basis of the design information, CM radiation amount ratio calculation means for calculating the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, and CM radiation amount calculation means for calculating the common mode (CM) radiation amount of the interconnection on the basis of the CM radiation amount ratio calculated by said CM radiation amount ratio calculation means and the differential mode (DM) radiation amount calculated by said DM radiation amount calculation means.

10. A printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising:

arithmetic means for calculating, as a major (MAJ) radiation amount that indicates a major radiation amount of electromagnetic radiation caused by the interconnection, a radiation amount corresponding to a sum of a differential mode (DM) radiation amount of electromagnetic radiation caused by the interconnection and a common mode (CM) radiation amount of electromagnetic radiation caused by the ground plane in correspondence with the interconnection.

11. An apparatus according to claim 10, wherein said arithmetic means comprises

DM radiation amount calculation means for calculating the differential mode (DM) radiation amount of the interconnection on the basis of the design information, CM radiation amount ratio calculation means for calculating a CM radiation amount ratio that indicates a ratio of the common mode (CM) radiation amount to the differential mode (DM) radiation amount of the interconnection on the basis of the design information, MAJ radiation amount ratio calculation means for calculating an MAJ radiation amount ratio that indicates a ratio of the major (MAJ) radiation amount to the differential mode (DM) radiation amount of the interconnection on the basis of the CM radiation amount ratio calculated by said CM radiation amount ratio calculation means, CM radiation amount calculation means for calculating the common mode (CM) radiation amount of the interconnection on the basis of the CM radiation amount ratio calculated by said CM radiation amount ratio calculation means and the differential mode (DM) radiation amount calculated by said DM radiation amount calculation means, and MAJ radiation amount calculation means for calculating the major (MAJ) radiation amount of the interconnection on the basis of the MAJ radiation amount ratio calculated by said MAJ radiation amount ratio calculation means and the differential mode (DM) radiation amount calculated by said DM radiation amount calculation means.

12. A printed circuit board design support method used in a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising:

causing arithmetic means of the printed circuit board design support apparatus to calculate a common mode (CM) radiation amount of the interconnection on the basis of a CM radiation amount ratio that indicates a ratio of a common mode (CM) radiation amount of electromagnetic radiation caused by the ground plane in correspondence with the interconnection to a differential mode (DM) radiation amount of electromagnetic radiation caused by the interconnection.

13. A method according to claim 12, wherein the arithmetic means calculates, as a major (MAJ) radiation amount that indicates a major radiation amount of electromagnetic radiation caused by the interconnection, a radiation amount corresponding to a sum of the differential mode (DM) radiation amount and common mode (CM) radiation amount of the interconnection.

14. A method according to claim 13, wherein the arithmetic means calculates the differential mode (DM) radiation amount of the interconnection on the basis of the design information, the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, the common mode (CM) radiation amount of the interconnection on the basis of the CM radiation amount ratio and differential mode (DM) radiation amount, an MAJ radiation amount ratio that indicates a ratio of the major (MAJ) radiation amount to the differential mode (DM) radiation amount of the interconnection on the basis of the CM radiation amount ratio, and the major (MAJ) radiation amount of the interconnection on the basis of the MAJ radiation amount ratio and differential mode (DM) radiation amount.

15. A method according to claim 13, wherein the arithmetic means calculates the differential mode (DM) radiation amount of the interconnection on the basis of the design information, letting a be a width of the ground plane opposing the interconnection in a direction parallel to the interconnection, b be a width in a direction perpendicular to the interconnection, and d be a distance from an edge of the ground plane to the interconnection, the CM radiation amount ratio CM/DM(a,b,d) that indicates the ratio of the common mode (CM) radiation amount to the differential mode (DM) radiation amount of the interconnection by $$CM/DM(a,b,d) = 10^{\frac{y_0(a,b)+0.35 \cdot \exp\left[\frac{1-d}{b/2}\right]}{20}}$$

$$y_0(a,b) = 0.57 + 24.47 \cdot \log\left(\frac{a}{b}\right) - 3.83 \cdot \left[\log\left(\frac{a}{b}\right)\right]^2$$

$$t(a,b) = 0.26 + 0.01 \cdot \left(\frac{a}{b}\right),$$

an MAJ radiation amount ratio MAJ/DM(a,b,d) that indicates a ratio of the major (MAJ) radiation amount to the differential mode (DM) radiation amount of the interconnection on the basis of the CM radiation amount ratio CM/DM(a,b,d) by $$MAJ/DM(a,b,d)=1+CM/DM(a,b,d),$$

the common mode (CM) radiation amount of the interconnection on the basis of the CM radiation amount ratio and differential mode (DM) radiation amount, and the major (MAJ) radiation amount of the interconnection on the basis of the MAJ radiation amount ratio and differential mode (DM) radiation amount.

16. A printed circuit board design support method used in a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, comprising:

causing arithmetic means of the printed circuit board design support apparatus to calculate, as a major (MAJ) radiation amount that indicates a major radiation amount of electromagnetic radiation caused by the interconnection, a radiation amount corresponding to a sum of a differential mode (DM) radiation amount of electromagnetic radiation caused by the interconnection and a common mode (CM) radiation amount of electromagnetic radiation caused by the ground plane in correspondence with the interconnection.

17. A program which causes a computer, which is arranged in a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, to execute processing of calculating a common mode (CM) radiation amount of the interconnection on the basis of a CM radiation amount ratio that indicates a ratio of a common mode (CM) radiation amount of electromagnetic radiation caused by the ground plane in correspondence with the interconnection to a differential mode (DM) radiation amount of electromagnetic radiation caused by the interconnection.

18. A program according to claim 17, wherein the computer is caused to further execute processing of calculating, as a major (MAJ) radiation amount that indicates a major radiation amount of electromagnetic radiation caused by the interconnection, a radiation amount corresponding to a sum of the differential mode (DM) radiation amount and common mode (CM) radiation amount of the interconnection.

19. A program according to claim 18, wherein the computer is caused to execute, as the processing operations, the steps of calculating the differential mode (DM) radiation amount of the interconnection on the basis of the design information, calculating the CM radiation amount ratio corresponding to a size of the printed circuit board and a position of the interconnection on the printed circuit board on the basis of a relationship, obtained in advance, between the CM radiation amount ratio and the size of the printed circuit board and the position of the interconnection on the printed circuit board, calculating the common mode (CM) radiation amount of the interconnection on the basis of the CM radiation amount ratio and differential mode (DM) radiation amount, calculating an MAJ radiation amount ratio that indicates a ratio of the major (MAJ) radiation amount to the differential mode (DM) radiation amount of the interconnection on the basis of the CM radiation amount ratio, and calculating the major (MAJ) radiation amount of the interconnection on the basis of the MAJ radiation amount ratio and differential mode (DM) radiation amount.

20. A program according to claim 18, wherein the computer is caused to execute, as the processing operations, the steps of calculating the differential mode (DM) radiation amount of the interconnection on the basis of the design information, letting a be a width of the ground plane opposing the interconnection in a direction parallel to the interconnection, b be a width in a direction perpendicular to the interconnection, and d be a distance from an edge of the ground plane to the interconnection, calculating the CM radiation amount ratio CM/DM(a,b,d) that indicates the ratio of the common mode (CM) radiation amount to the differential mode (DM) radiation amount of the interconnection by $$CM/DM(a,b,d) = 10^{\frac{y_0(a,b)+0.35 \cdot \exp\left[\frac{1-d}{b/2}\right]}{20}}$$

$$y_0(a,b) = 0.57 + 24.47 \cdot \log\left(\frac{a}{b}\right) - 3.83 \cdot \left[\log\left(\frac{a}{b}\right)\right]^2$$

$$t(a,b) = 0.26 + 0.01 \cdot \left(\frac{a}{b}\right),$$

calculating an MAJ radiation amount ratio MAJ/DM(a, b,d) that indicates a ratio of the major (MAJ) radiation amount to the differential mode (DM) radiation amount of the interconnection on the basis of the CM radiation amount ratio CM/DM(a,b,d) by $$MAJ/DM(a,b,d)=1+CM/DM(a,b,d),$$

calculating the common mode (CM) radiation amount of the interconnection on the basis of the CM radiation amount ratio and differential mode (DM) radiation amount, and calculating the major (MAJ) radiation amount of the interconnection on the basis of the MAJ radiation amount ratio and differential mode (DM) radiation amount.

21. A program which causes a computer, which is arranged in a printed circuit board design support apparatus for supporting design of a printed circuit board by calculating a radiation amount of electromagnetic radiation caused by an interconnection on the basis of design information related to each of the printed circuit board having a ground plane, interconnections formed on the printed circuit board, and components to be mounted on the printed circuit board, to execute processing of calculating, as a major (MAJ) radiation amount that indicates a major radiation amount of electromagnetic radiation caused by the interconnection, a radiation amount corresponding to a sum of a differential mode (DM) radiation amount of electromagnetic radiation caused by the interconnection and a common mode (CM) radiation amount of electromagnetic radiation caused by the ground plane in correspondence with the interconnection.

* * * * *